(12) United States Patent
Fan

(10) Patent No.: US 12,040,438 B2
(45) Date of Patent: Jul. 16, 2024

(54) LIGHT-EMITTING DISPLAY DEVICE AND METHOD OF MANUFACTURING THE SAME

(71) Applicant: Wen-Cheng Fan, Zhubei (TW)

(72) Inventor: Wen-Cheng Fan, Zhubei (TW)

( * ) Notice: Subject to any disclaimer, the term of this patent is extended or adjusted under 35 U.S.C. 154(b) by 382 days.

(21) Appl. No.: 17/532,622

(22) Filed: Nov. 22, 2021

(65) Prior Publication Data

US 2022/0173293 A1    Jun. 2, 2022

Related U.S. Application Data

(60) Provisional application No. 63/119,269, filed on Nov. 30, 2020.

(30) Foreign Application Priority Data

Feb. 27, 2021 (TW) .................................. 110107196
May 8, 2021 (TW) .................................. 110205210

(51) Int. Cl.
*H01L 33/62* (2010.01)
*H01L 27/15* (2006.01)
*H01L 33/00* (2010.01)
*H01L 33/52* (2010.01)

(52) U.S. Cl.
CPC ............. *H01L 33/62* (2013.01); *H01L 27/156* (2013.01); *H01L 33/005* (2013.01); *H01L 33/52* (2013.01); *H01L 2933/0066* (2013.01)

(58) Field of Classification Search
CPC ......... H01L 33/06; H01L 33/62; H01L 33/52; H01L 33/54; H01L 33/36–387; H01L 2933/0066; H01L 2933/005; H01L 2933/0016; H01L 27/15; H01L 27/153; H01L 27/156; H01L 25/075; H01L 25/0753

See application file for complete search history.

(56) References Cited

U.S. PATENT DOCUMENTS

2022/0376137 A1* 11/2022 Wang ..................... H01L 33/382

* cited by examiner

*Primary Examiner* — Moazzam Hossain
(74) *Attorney, Agent, or Firm* — Muncy, Geissler, Olds & Lowe, P.C.

(57) ABSTRACT

A light-emitting display device has a substrate, at least four electrically isolated soldering pad regions, and a plurality of light-emitting assemblies. The minimum distance between the light-emitting assemblies is at least 2 mm. The soldering pad regions are correspondingly in electrical connection with the input voltage pin, the data signal input or output pin, the clock signal input or output pin, and the ground pin of one of the light-emitting assemblies. The soldering pad region which is in electrical connection with the input voltage pin is electrically connected with a first grid wiring, the soldering pad region which is in electrical connection with the ground pin is electrically connected with a second grid wiring, and the soldering pad region which is in electrical connection with the data signal input pin, the data signal output pin, the clock signal input pin, or the clock signal output pin is electrically connected with a slender wire. The slender wire and the soldering pad regions are formed in a patterned conductive layer.

15 Claims, 15 Drawing Sheets

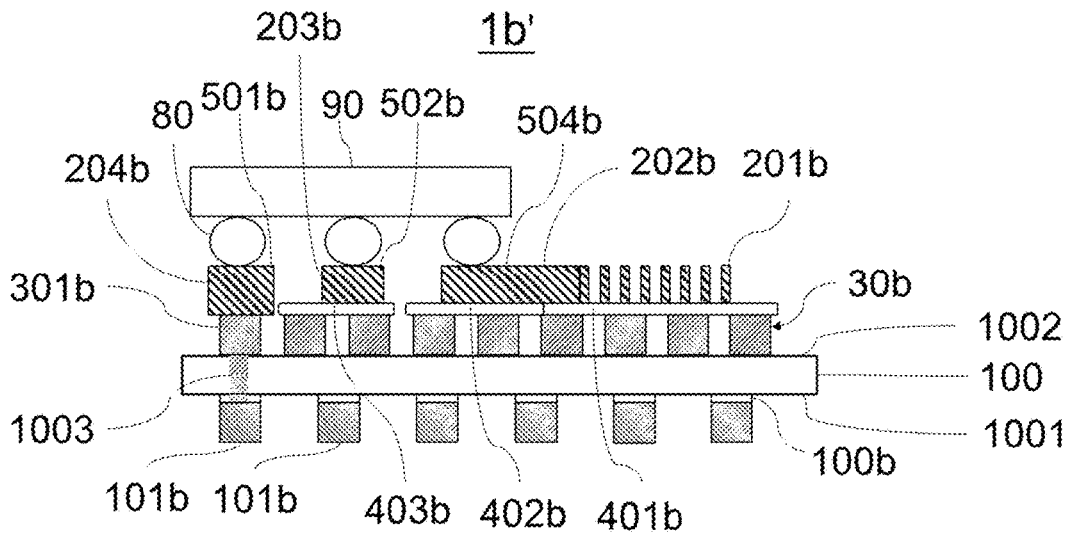

FIG. 2E

```
                    ┌─────────────────────────────────────────────┐ 41
                    │  providing a substrate having a plurality of through holes  │
                    └─────────────────────────────────────────────┘
                                         ↓                                          42
┌──────────────────────────────────────────────────────────────────────────────┐
│ forming on the first surface of the substrate with a first patterned conductive metallic seed layer in a process │
│                selected from a group consisting of sputtering, screen printing and spray printing                │
└──────────────────────────────────────────────────────────────────────────────┘
                                         ↓                                          43
┌──────────────────────────────────────────────────────────────────────────────┐
│ forming on the first patterned conductive metallic seed layer with a first patterned conductive layer including a │
│ first grid wiring in a process selected from a group consisting of sputtering, etching, chemical plating and      │
│ electroplating, aligning at least one grid node of the first grid wiring with one of the through holes, and plating │
│         the through holes with the material of the first grid wiring at the end on the first surface of the substrate │
└──────────────────────────────────────────────────────────────────────────────┘
                                         ↓                                          44
┌──────────────────────────────────────────────────────────────────────────────┐
│ forming on the second surface of the substrate with a third patterned conductive layer including the third grid  │
│  wiring in a process selected from a group consisting of screen printing and spray printing, filling the through  │
│  holes with the material of the third grid wiring at the end on the second surface of the substrate, and electrically │
│       connecting a portion of the third grid wiring with the first grid wiring by means of one of the through holes │
└──────────────────────────────────────────────────────────────────────────────┘
                                         ↓                                          45
┌──────────────────────────────────────────────────────────────────────────────┐
│ forming on top of the third patterned conductive layer with a patterned electrically insulative layer in a process │
│ selected from a group consisting of screen printing and spray printing, and exposing a portion of the third grid │
│                          wiring from the patterned electrically insulative layer                                  │
└──────────────────────────────────────────────────────────────────────────────┘
                                         ↓                                          46
┌──────────────────────────────────────────────────────────────────────────────┐
│      forming on top of the patterned electrically insulative layer with the second patterned conductive layer in a │
│ process selected from a group consisting of screen printing and spray printing, respectively disposing the second │
│  grid wiring, the second grid wiring extension, and each of the first slender wires on the first, second, and third │
│          electrically insulative segments, and directly contacting the island with the exposed portion of the third grid │
│                                                    wiring                                                         │
└──────────────────────────────────────────────────────────────────────────────┘
                                         ↓                                          47
┌──────────────────────────────────────────────────────────────────────────────┐
│   respectively configuring a portion of the island and a portion of the second grid wiring extension into the     │
│ soldering pad regions that are correspondingly electrically connected to the input voltage pin and the ground pin │
│                                of the passive light-emitting assembly                                             │
└──────────────────────────────────────────────────────────────────────────────┘
```

FIG. 2F

LIGHT-EMITTING DISPLAY DEVICE AND METHOD OF MANUFACTURING THE SAME

TECHNICAL FIELD

The present invention relates to a display device and especially to a light-emitting display device and method of manufacturing the same.

BACKGROUND

The technology development of light-emitting display having flexible substrate to dispose point-type light-emitting sources has become important in view of the request for larger, planar, thinner, lighter, and flexible display. In a branch of the technology development, the follow-up of large-screen light-emitting displays developed by using light-emitting diodes (LEDs) as passive light-emitting sources and for people to watch from a distance is worthy of attention.

Being different from organic light-emitting diode (OLED) displays and micro-size light-emitting diode (Micro-LED) displays for people to watch before one's eyes, these light-emitting displays for people to watch from a distance can be produced by installing a plurality of LED packages each being composed of multiple LEDs and drive ICs thereof on a transparent substrate in the form of an array with the distance between the LED packages being not less than 2 mm. To light up each LED package in the array to the extent that the brightness of the LED packages is well satisfied, the substrate and wirings for the installation of the LED packages must have good electrical conductivity. In addition, it is important to reduce the visibility of the wirings and increase the aperture ratio in the display screen to improve the contrast of such light-emitting displays. On the other hand, it is desired that the wirings have flexible changeability in design and that the wirings can be produced in an efficient way to perform display effects required in various applications. In view of the above technical problems, the present invention aiming to provide solutions.

SUMMARY

In view of the above issues, this application proposes a light-emitting display device and a method of manufacturing the light-emitting display device.

On the one hand, the light-emitting display device is disclosed. In one embodiment, the light-emitting display device has a substrate, a plurality of passive light-emitting assemblies, at least four soldering pad regions, a first grid wiring, a second grid wiring, a linear extension of the second grid wiring, and a plurality of linear first slender wires. The substrate has a first surface and a second surface opposite to each other, and a plurality of through holes connecting the first surface and the second surface. The light-emitting assemblies are disposed on top of the second surface with the minimum distance between the passive light-emitting assemblies being at least 2 mm. The soldering pad regions are disposed on the second surface and electrically isolated from one another and correspondingly connected with an input voltage pin, a data signal input pin, a data signal output pin, a clock signal input pin, a clock signal output pin, and a ground pin of one of the passive light-emitting assemblies having a driver IC of at least a light-emitting diode. The first grid wiring has a plurality of grids and ranges from ten micrometers to one hundred micrometers in linewidth. The second grid wiring has a plurality of grids and ranges from ten micrometers to one hundred micrometers in linewidth. The linear extension connects a grid node of the second grid wiring and lays in the plane of the second grid wiring. The linear first slender wires lay in a direction with which the first grid wiring and the second grid wiring are not intersected. The number of the first slender wires is the same as the number of the data signal input pin, the data signal output pin, the clock signal input pin, and the clock signal output pin of one of the passive light-emitting assemblies. The soldering pad region correspondingly connected with the input voltage pin of one of the passive light-emitting assemblies is in electrical connection with the first gird wiring; the soldering pad region correspondingly connected with the ground pin of one of the passive light-emitting assemblies is in electrical connection with the second grid wiring; the soldering pad region correspondingly connected with the data signal input pin, the data signal output pin, the clock signal input pin, or the clock signal output pin of one of the passive light-emitting assemblies is in electrical connection with one of the first slender wires.

In one embodiment, the first grid wiring may be formed in a first patterned conductive layer on top of the first surface of the substrate, the second grid wiring and the linear extension of the second grid wiring and the soldering pad regions and the linear first slender wires may be formed in a second patterned conductive layer on top of the second surface of the substrate, the soldering pad region correspondingly connected with the input voltage pin of the passive light-emitting assembly may be in electrical connection with the first gird wire by means of one of the through holes, and the soldering pad region correspondingly connected with the ground pin of the passive light-emitting assembly may be in electrical connection with the second grid wiring by means of the linear extension of the second grid wiring.

In one embodiment, all of the first grid wirings may occupy 70% to 90% of the area of the first surface of the substrate.

In one embodiment, the second patterned conductive layer may be further formed with an island separated from the second grid wiring and the first slender wire and connected with the first grid wiring by means of one of the through holes, and the soldering pad region correspondingly connected with the input voltage pin of the passive light-emitting assembly may be connected to one of the through holes by means of the island.

In one embodiment, the light-emitting device may further have a third grid wiring and a patterned electrically insulative layer. The third grid wiring has a plurality of grids formed in a third patterned conductive layer on top of the second surface and below the second patterned conductive layer. All of the third grid wirings may occupy 70% to 90% of the area of the second surface of the substrate. The patterned electrically insulative layer is disposed between the third patterned conductive layer and the second patterned conductive layer to electrically isolate the second patterned conductive layer and the third patterned conductive layer. A portion of the third grid wiring is electrically connected with the first grid wiring by means of one of the through holes.

In one embodiment, the patterned electrically insulative layer may have a plurality of first electrically insulative segments, a plurality of second electrically insulative segments, and a plurality of third electrically insulative segments. In addition, each of the first electrically insulative segments covers a configuration area on the third patterned conductive layer corresponding to the second grid wiring to isolate the electrical contact between the second grid wiring and the third grid wiring; each of the second electrically insulative segments covers a configuration area on the third patterned conductive layer corresponding to a part of the linear extension of the second grid wiring and the soldering pad region connected with the linear extension to isolate the electrical contact between the linear extension, the soldering pad region connected with the linear extension and the third grid wiring; each of the third electrically insulative segments covers a configuration area on the third patterned conductive layer corresponding to each of the first slender wires including the portion connecting the soldering pad region to isolate the electrical contact between the first slender wire and the third grid wiring. The portion of the third grid wiring which is electrically connected to the first grid wiring by means of one of the through holes is exposed from the patterned electrically insulative layer.

In one embodiment, the patterned electrically insulative layer may have a plurality of first electrically insulative segments, a plurality of second electrically insulative segments, and a plurality of third electrically insulative segments. In addition, each of the first electrically insulative segments covers a configuration area on the third patterned conductive layer corresponding to the second grid wiring to isolate the electrical contact between the second grid wiring and the third grid wiring; each of the second electrically insulative segments covers a configuration area on the third patterned conductive layer corresponding to a part of the linear extension connecting the second grid wiring to isolate the electrical contact between the part of the linear extension and the third grid wiring; each of the third electrically insulative segments covers a configuration area on the third patterned conductive layer corresponding to each of the first slender wires excluding the soldering pad region connecting portion to isolate the electrical contact between the first slender wire and the third grid wiring. The portion of the third grid wiring which is electrically connected to the first grid wiring by means of one of the through holes is exposed from the patterned electrically insulative layer. All of the soldering pad regions are exposed from the patterned electrically insulative layer. The soldering pad region connecting portion of each first slender wire are disposed on the second surface. The other part of the linear extension which is connected to the soldering pad region correspondingly connected with the ground pin of one of the passive light-emitting assemblies is disposed on the second surface.

In one embodiment, the light-emitting display device may further have a linear extension of the first grid wiring connecting a grid node of the first grid wiring and laying in the plane for arranging the first grid wiring. The first grid wiring, the linear extension of the first grid wiring, the second grid wiring, the linear extension of the second grid wiring, and the first slender wires are all formed in a first patterned conductive layer formed on the first surface of the substrate. The soldering pad region correspondingly connected with the input voltage pin of one of the passive light-emitting assemblies is in electrical connection with the linear extension of the first grid wiring by means of one of the through holes. The soldering pad region correspondingly connected with the ground pin of one of the passive light-emitting assemblies is in electrical connection with the linear extension of the second grid wiring by means of one of the through holes.

In one embodiment, the second patterned conductive layer may be formed with a plurality of islands each being connected with one of the soldering pad regions and one of the through holes.

In one embodiment, the light-emitting display device may further have a plurality of linear second slender wires the number of which being the same as the number of the input voltage pin, the data signal input pin, the data signal output pin, the clock signal input pin, the clock signal output pin, and the ground pin of one of the passive light-emitting assemblies. The second slender wires are duplicate wires of the first slender wires and are overlapped with the first slender wires in the vertical direction of the substrate; the second slender wires and the soldering pad regions are formed in a second patterned conductive layer on top of the second surface of the substrate; and the soldering pad region correspondingly connected with the data signal input pin, the data signal output pin, the clock signal input pin, or the clock signal output pin of one of the passive light-emitting assemblies is in electrical connection with one of the second slender wires.

In one embodiment, the light-emitting display device may further have a duplicate wiring of the first grid wiring and a linear extension of the duplicate wiring of the first grid wiring, the linear extension of the duplicate wiring of the first grid wiring connecting a grid node of the duplicate wiring of the first grid wiring and laying in the plane for arranging the duplicate wiring of the first grid wiring. The direction in which the second slender wires lay does not intersect with the duplicate wiring of the first grid wiring; the duplicate wiring of the first grid wiring, the linear extension of the duplicate wiring of the first grid wiring, and the second slender wires are formed in the second patterned conductive layer; the duplicate wiring of the first grid wiring is overlapped with the first grid wiring in the vertical direction of the substrate; and the soldering pad region correspondingly connected with the input voltage pin of one of the passive light-emitting assemblies is in electrical connection with the duplicate wiring of the first grid wiring by means of the linear extension of the duplicate wiring of the first grid wiring.

In one embodiment, the light-emitting display device may further have a duplicate wiring of the second grid wiring and a linear extension of the duplicate wiring of the second grid wiring, the linear extension of the duplicate wiring of the second grid wiring connecting a grid node of the duplicate wiring of the second grid wiring and laying in the plane for arranging the duplicate wiring of the second grid wiring. The direction in which the second slender wires lay does not intersect with the duplicate wiring of the second grid wiring; the duplicate wiring of the second grid wiring, the linear extension of the duplicate wiring of the second grid wiring, and the second slender wires are formed in the second patterned conductive layer; the duplicate wiring of the second grid wiring is overlapped with the second grid wiring in the vertical direction of the substrate; and the soldering pad region correspondingly connected with the ground pin of one of the passive light-emitting assemblies is in electrical connection with the duplicate wiring of the second grid wiring by means of the linear extension of the duplicate wiring of the second grid wiring.

In one embodiment, the light-emitting display device may further have a transparent protective layer disposed on top of the passive light-emitting assemblies. The protective layer has its top surface being higher than the top surfaces of all of the passive light-emitting assemblies, covers all of the passive light-emitting assemblies, and has a refractive index being greater than or equal to the refractive index of a light-emitting surface of one of the passive light-emitting assemblies.

In one embodiment, the light-emitting display device may further have a transparent substrate disposed on top of the transparent protective layer and attached to the top surface of the transparent protective layer, wherein the refractive index of the transparent substrate is greater than or equal to the refractive index of the protective layer.

In one embodiment, the light-emitting display device may further have at least one anti-reflection film disposed on the top surface of the transparent substrate, wherein the refractive index of the anti-reflection film is smaller than or equal to the refractive index of the transparent substrate while greater than or equal to the refractive index of the air.

On the other hand, the method of manufacturing the light-emitting display device is disclosed. In one embodiment, the method has the following steps. providing a substrate having a first surface and a second surface being opposite to each other and forming a plurality of through holes in the substrate to connect the first surface and the second surface; forming on the second surface with at least four soldering pad regions electrically isolated from one another and correspondingly connected with an input voltage pin, a data signal input pin, a data signal output pin, a clock signal input pin, a clock signal output pin, and a ground pin of a passive light-emitting assembly having a drive IC of at least a light-emitting diode; forming on the first surface with a first grid wiring having a plurality of grids; forming on the first surface or the second surface with a second grid wiring having a plurality of grids; establishing electrical connection between the first grid wiring and the soldering pad region correspondingly connected with the input voltage pin of the passive light-emitting assembly by means of one of the through holes; and establishing electrical connection between the second grid wiring and the soldering pad region correspondingly connected with the ground pin of the passive light-emitting assembly.

In one embodiment, the method may further has the following steps: forming on the second surface with a plurality of first slender wires being in parallel with each other, and respectively connecting the first slender wires to the soldering pad regions correspondingly connected with the data signal input pin, the data signal output pin, the clock signal input pin, and the clock signal output pin of the passive light-emitting assembly.

In one embodiment, in the abovementioned method, the first slender wires and the second grid wiring are formed in the same patterned conductive layer in a process selected from a group consisting of screen printing and spray printing.

According to the proposed light-emitting display device and method of manufacturing the light-emitting display device, the input voltage connection wiring and the ground wiring for the soldering pad regions are distantly spaced at different sides of a substrate so as to increase the spaces for arrangement of the input voltage connection wiring and the ground wiring, respectively. Therefore, the input voltage connection wiring and the ground wiring can be subdivided into multiple-grid shaped wires with smaller linewidth in the enlarged space to improve the transparency of the display screen. In this way, when the substrate on which the passive light-emitting assembly is mounted is transparent, the visibility of those multiple-grid shaped wires on the substrate in the display screen can be reduced, thereby improving the contrast and clarity of remotely viewing this type of light-emitting display. Furthermore, the patterned conductive layer and the passive light-emitting assembly in the light-emitting display device can be further covered with a transparent protective layer to prevent the patterned conductive layer and the passive light-emitting assembly from being polluted and damaged by the external environment. The optical characteristics of the selected transparent protective layer can increase the amount of light emitted by the passive light-emitting assembly and reduce the amount of reflected light on the screen substrate reaching the wiring layer, thereby preventing people behind the wiring layer from seeing the reflected light. Furthermore, when an extra transparent substrate is attached to the transparent protective layer, a single-layer or multi-layer anti-reflection film can be arranged on this extra transparent substrate to reduce the reflection of the light emitted from the light-emitting display device and the ambient light between this extra transparent substrate and the air. It can also prevent people behind the wiring layer from seeing the reflected light. On the other hand, since each patterned conductive layer can be produced by a printing process such as screen printing or spray printing, the near-infrared light irradiation may be used to quickly cure the patterned conductive layer to shorten the process time and facilitate the process procedure.

BRIEF DESCRIPTION OF DRAWINGS

The following detailed descriptions, given by listing examples which are to limit the present invention solely thereto, will be understood in a better way in conjunction with the accompanying figures.

FIG. 2E is a schematic cross-sectional view illustrating A-A section of the light-emitting device of FIG. 2B manufactured in another process.

FIG. 2F is a flow chart illustrating a method of manufacturing the light-emitting device of FIG. 2E.

DETAILED DESCRIPTION OF THE EMBODIMENTS

Figure 1A:
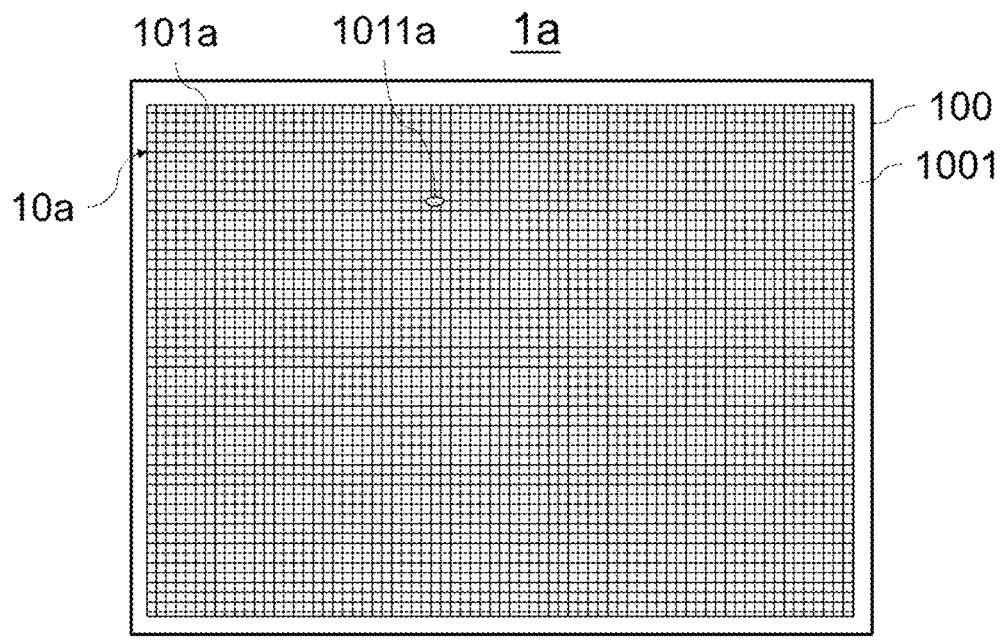
FIG. 1A is a schematic plan view illustrating a first patterned conductive layer disposed on a first surface of a substrate of a light-emitting display device according to a first embodiment of the present invention.
Figure 1B:
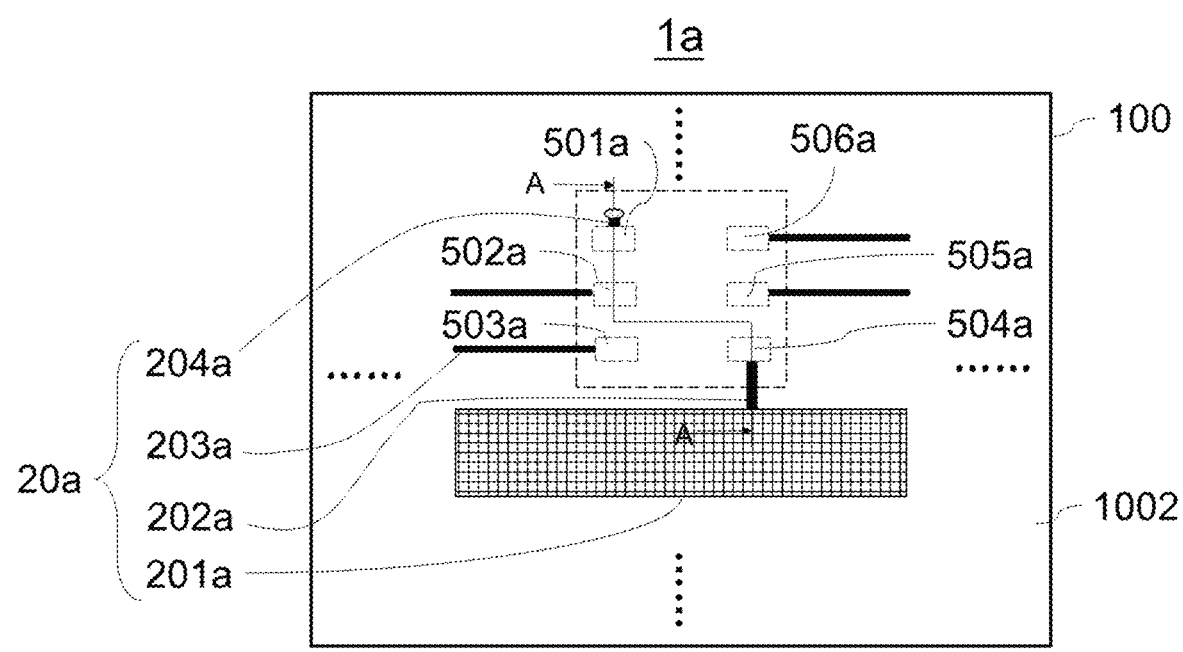
FIG. 1B is a schematic plan view illustrating a second patterned conductive layer disposed on a second surface of the substrate of the light-emitting display device according to the first embodiment of the present invention.
Figure 1C:
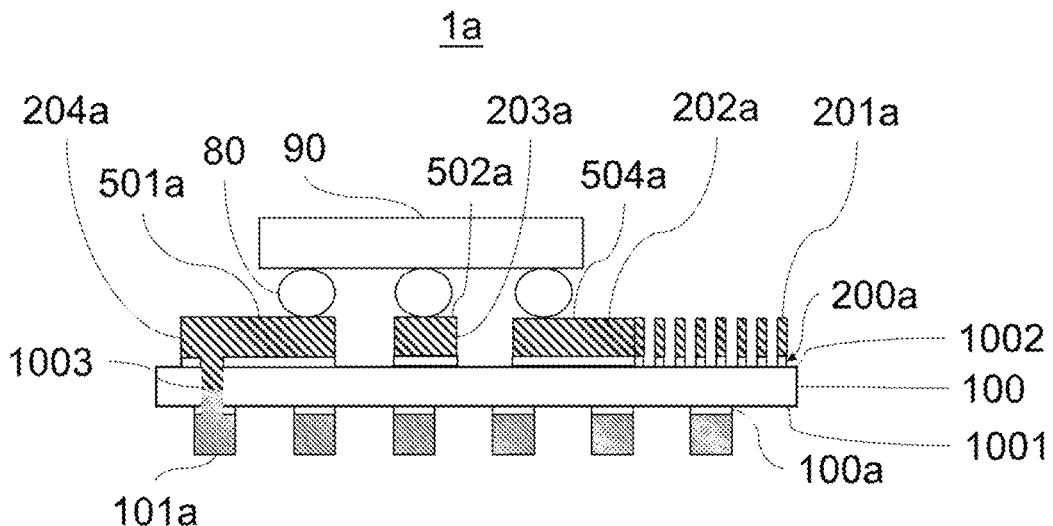
FIG. 1C is a schematic cross-sectional view illustrating A-A section of the light-emitting device of FIG. 1B manufactured in one process.

Referring to FIGS. 1A to 1C, in the first embodiment, the light-emitting display device 1a has a substrate 100, first soldering pad region 501a to sixth soldering pad region 506a spaced and electrically isolated from one another on the substrate 100, and a plurality of passive light-emitting assemblies 90. The minimum distance between the passive light-emitting assemblies 90 is at least 2 mm, preferably 2 to 3 mm, and therefore is distinguished from an organic light-emitting diode (OLED) display or a micro-sized light-emitting diode (Micro-LED) display. Each passive light-emitting assembly 90 has more than one light-emitting diodes (LEDs) emitting red light, green light, and blue light and their driving IC. The light-emitting assembly 90 therefore has an input voltage pin, a data signal input pin, a clock signal input pin, a ground pin, a clock signal output pin and a data signal output pin which are to be correspondingly fixed and electrically connected to the first soldering pad region 501a, the second soldering pad region 502a, the third soldering pad region 503a, the fourth soldering pad region 504a, the fifth soldering pad region 505a, and the sixth soldering pad region 506a by means of the electrical connection material 80 such as solder paste. In other embodiments, the data signal input pin and the data signal output pin may be combined, or the clock signal input pin and the clock signal output pin may be combined, or the data signal input pin and the clock signal input pin may be combined, or the data signal output pin and the clock signal output pin may be combined, so the six soldering pad regions can be integrated into only four or five soldering pad regions. The material of the substrate 100 is preferably transparent, and may be glass, ceramic, aluminum nitride ceramic, polycarbonate, polyethylene terephthalate, polyimide, polymethyl ester, BT resin, glass fiber or cycloolefin copolymer.

Referring to FIGS. 1A to 1C, in this embodiment, the substrate 100 has a first surface 1001 and a second surface 1002 opposite to each other, and a plurality of through holes 1003 connecting the first surface 1001 and the second surface 1002. A first patterned conductive layer 10a is disposed on the first surface 1001, and a second patterned conductive layer 20a is disposed on the second surface 1002. The second patterned conductive layer 20a includes the first soldering pad region 501a to the sixth soldering pad region 506a. If the local area including the first soldering pad region to the sixth soldering pad region is regarded as a soldering pad region unit, then there are many soldering pad region units on the second surface 1002 of the substrate 100 in form of a spreading array, and all of the passive light-emitting assemblies 90 will be respectively fixed to the corresponding soldering pad region units and arranged on top of the second surface 1002 in form of an array.

Referring to FIGS. 1A to 1C, the first soldering pad region 501a which is electrically connected to the input voltage pin of the passive light-emitting assembly 90 is electrically connected to a first grid wiring 101a, and the fourth soldering pad region 504a which is electrically connected to the ground pin of the passive light-emitting assembly 90 is electrically connected to a second grid wiring 201a. The second soldering pad region 502a, the third soldering pad region 503a, the fifth soldering pad region 505a, and the sixth pad region 506a which are correspondingly electrically connected to the data signal input pin, clock signal input pin, clock signal output pin, and data signal output pin of the passive light-emitting assembly 90 are each electrically connected to a first slender wire 203a. The number of the first slender wire 203a as required is the same as the number of input voltage pin, data signal input pin, data signal output pin, clock signal input pin, clock signal output pin, and ground pin. In an embodiment where only four soldering pad regions are disposed, only two of the first slender wire 203a may be required. The first slender wires 203a are not intersected with the first grid wiring 101a or the second grid wiring 201a. Both the first grid wiring 101a and the second grid wiring 201a are formed to have multiple grids with each grid being rectangular, hexagonal, or circular, which is not limited in the present invention. The first slender wire 203a is linear in shape.

In the embodiments of FIGS. 1A to 1C, the first grid wiring 101a is formed in the first patterned conductive layer 10a and all of the first grid wirings may occupy 70% to 90% of the area of the first surface 1001 of the substrate 100. The second grid wiring 201a is formed in the second patterned conductive layer 20a. The first slender wires 203a are formed in the second patterned conductive layer 20a and are parallel to and equally or unequally spaced apart from each other. Furthermore, at least one linear extension 202a of the second grid wiring connects a grid node of the second grid wiring 201a. The extension 202a is connected to the fourth soldering pad region 504a and is also formed in the second patterned conductive layer 20a. The extension 202a lays in the plane of the second grid wiring 201a and crosses the laying direction of the first slender wire 203a, for example, to be perpendicular. Furthermore, the second patterned conductive layer 20a is also formed with an island 204a separated from the second grid wiring 201a and the first slender wire 203a. The island 204a is electrically connected to a grid node 1011a of the first grid wiring 101a by means of one of the through holes 1003. The soldering pad region 501a that is electrically connected to the input voltage pin of the passive light-emitting assembly 90 is connected to a through hole 1003 by means of the island 204a. The so-called grid node is the intersection of the sub wires composed of the grid wirings.

Referring to FIGS. 1B and 1C, the first soldering pad region 501a is connected to the island 204a and is connected to the first grid wiring 101a by means of the island 204a and the through hole 1003. The fourth soldering pad region 504a is connected to the second grid wiring 201a by means of the second grid wiring extension 202a. In other words, the first grid wiring 101a and the island 204a are collectively used as the input voltage connection wiring of the passive light-emitting assembly 90. The second grid wiring 201a and its extension 202a are collectively used as the ground connection wiring of the passive light-emitting assembly 90. The first slender wire 203a is used as the input or output connection wiring for the data signal or clock signal of the passive light-emitting assembly 90. Therefore, the first grid wiring 101a and the second grid wiring 201a are used to endure the driving voltage and current of the passive light-emitting assembly 90. In order to reduce the visibility of the first grid wiring 101a, the second grid wiring 201a, the extension 202a and the first slender wire 203a, the linewidth of these wires can be reduced without affecting the required conductivity. In an embodiment, the linewidths of the first grid wiring 101a, the second grid wiring 201a, the extension 202a and the first slender wire 203a are 10 micrometers to 100 micrometers.

Referring to FIG. 1C, in one embodiment, a first patterned conductive metallic seed layer 100a can be further formed on the first surface 1001 of the light-emitting display device 1a. The first patterned conductive metallic seed layer 100a has the same pattern as the pattern of the first grid wiring 101a of the first patterned conductive layer 10a and is served as a preparation layer for the formation of the first patterned conductive layer 10a. The first patterned conductive metallic seed layer 100a is helpful in making the first patterned conductive layer 10a attached to the substrate 100 after the first patterned conductive layer 10a is formed. Similarly, in one embodiment, a second patterned conductive metallic seed layer 200a can be further formed on the second surface 1002 of the light-emitting display device 1a. The second patterned conductive metallic seed layer 200a has the same pattern as the patterns of the second grid wiring 201a, the extension 202a, the first slender wire 203a and the island 204a of the second patterned conductive layer 20a and is served as a preparation layer for the formation of the second patterned conductive layer 20a. The second patterned conductive metallic seed layer 200a is helpful in making the second patterned conductive layer 20a attached to the substrate 100 after the second patterned conductive layer 20a is formed. In one embodiment, the method of manufacturing the light-emitting display device of FIG. 1C includes steps 11 to 16 of FIGS. 1D and 1s described in the following with referring to FIGS. 1A to 1D.

Step 11: Providing a substrate 100 having a plurality of through holes 1003.

Step 12: Forming a first patterned conductive metallic seed layer 100a on the first surface 1001 of the substrate 100 in a process selected from a group consisting of sputtering, screen printing and spray printing.

Step 13: Forming on the first patterned conductive metallic seed layer 100a with a first patterned conductive layer 10a including a first grid wiring 101a in a process selected from a group consisting of sputtering, etching, chemical plating and electroplating. Aligning at least one grid node of the first grid wiring with a through hole 1003 and plating the through hole 1003 with the material of the first grid wiring 101a at the end on the first surface 1001 of the substrate 100.

Step 14: Forming on the second surface 1002 of the substrate 100 with a second patterned conductive metallic seed layer 200a in a process selected from a group consisting of sputtering, screen printing and spray printing.

Step 15: Forming on the second patterned conductive metallic seed layer 200a with a second patterned conductive layer 20a including a second grid wiring 201a, at least one second grid wiring extension 202a connected from a grid node of the second grid wiring 201a, at least two first slender wires 203a and island 204a in a process selected from a group consisting of sputtering, etching, chemical plating and electroplating. In addition, plating the through hole 1003, which is plated with the material of the first grid wiring 101a at one end, with the material of the island 204a at the other end on the second surface 1003 of the substrate 100, and electrically connecting the island 204a to the first grid wiring 101a by means of the through hole 1003. The second grid wiring, the extension, the first slender wire and the island may be formed in a single process or multiple processes. The island 204a and the second grid wiring 201a may be made in the same or different material.

Step 16: Respectively configuring a portion of the island 204a and a portion of the extension 202a of the second grid wiring as the soldering pad region 501a electrically connected to the input voltage pin of the passive light-emitting assembly 90 and the soldering pad region 504a electrically connected to the ground pin of the passive light-emitting assembly 90. Furthermore, the first slender wires 203a next to each other have their respective portions respectively configured as the second soldering pad region 502a, the third soldering pad region 503a, the fifth soldering pad region 505a and the sixth soldering pad region 506a that are respectively electrically connected to the data signal input pin, the clock signal input pin, the clock signal output pin and the data signal output pin of the passive light-emitting assembly 90.

Figure 1D:
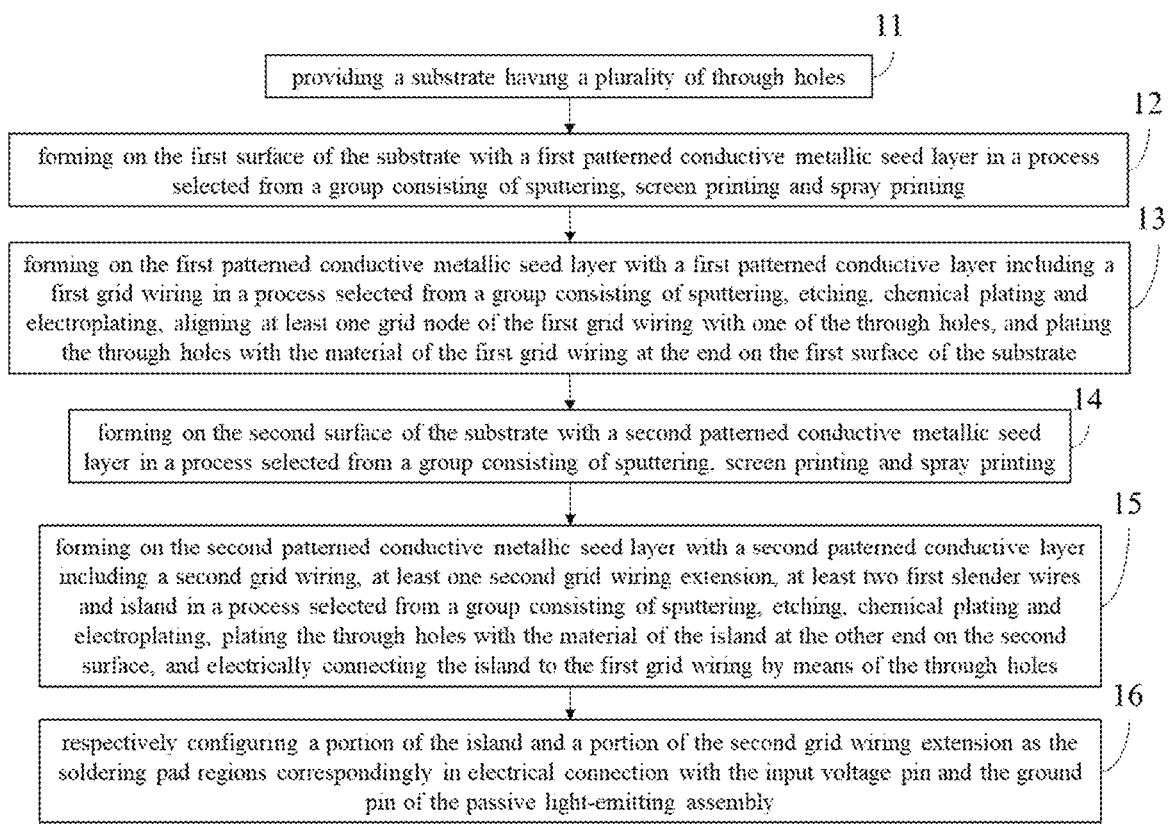
FIG. 1D is a flow chart illustrating a method of manufacturing the light-emitting device of FIG. 1C.
Figure 1E:
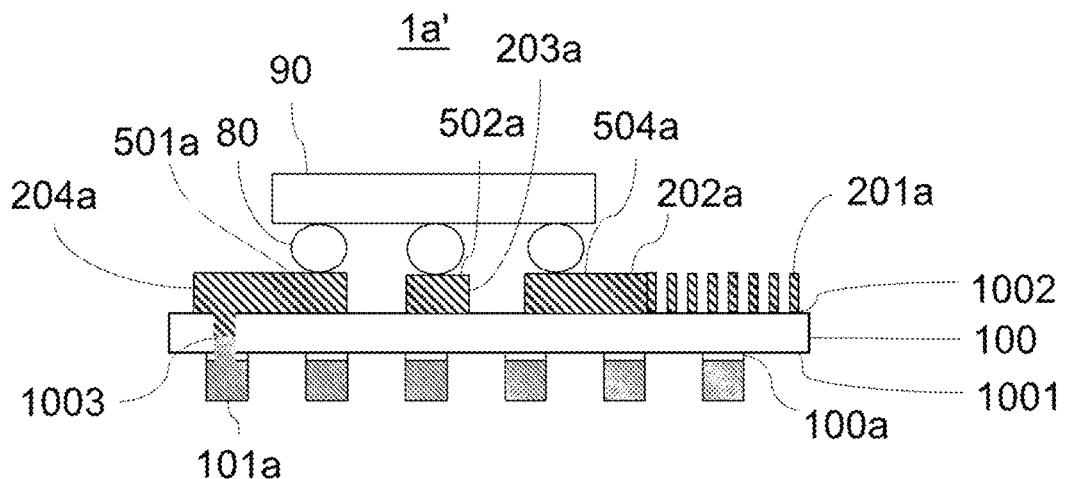
FIG. 1E is a schematic cross-sectional view illustrating A-A section of the light-emitting device of FIG. 1B manufactured in another process.
Figure 1F:
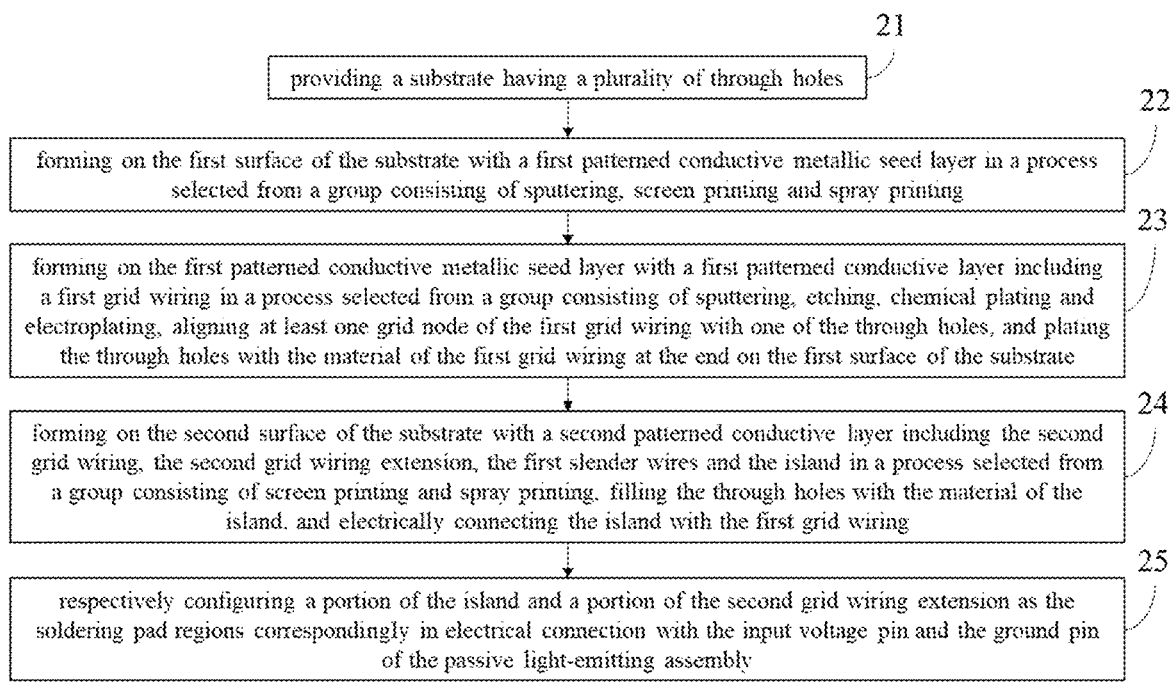
FIG. 1F is a flow chart illustrating a method of manufacturing the light-emitting device of FIG. 1E.

As shown in FIG. 1E, in another embodiment, a light-emitting display device 1a' is the same as that in FIG. 1C except that the second patterned conductive metallic seed layer 200a may be excluded. The detail descriptions with respect to those features already shown in FIG. 1C will not be repeated. The method of manufacturing the light-emitting display device of FIG. 1E includes steps 21 to 25 in FIG. 1F. As described in the following, steps 21 to 23 and 25 are respectively the same as steps 11 to 13 and 16 in FIG. 1D, while step 24 replaces steps 14 and 15.

Step 24: Forming on the second surface 1002 of the substrate 100 with a second patterned conductive layer 20a including the second grid wiring 201a, the extension 202a, the first slender wire 203a and the island 204a in a process selected from a group consisting of screen printing and spray printing. In addition, filling the through holes, which has been plated with the material of the first grid wiring at the end on the second surface of the substrate, with the material of the island, and electrically connecting the island with the first grid wiring.

Figure 2A:
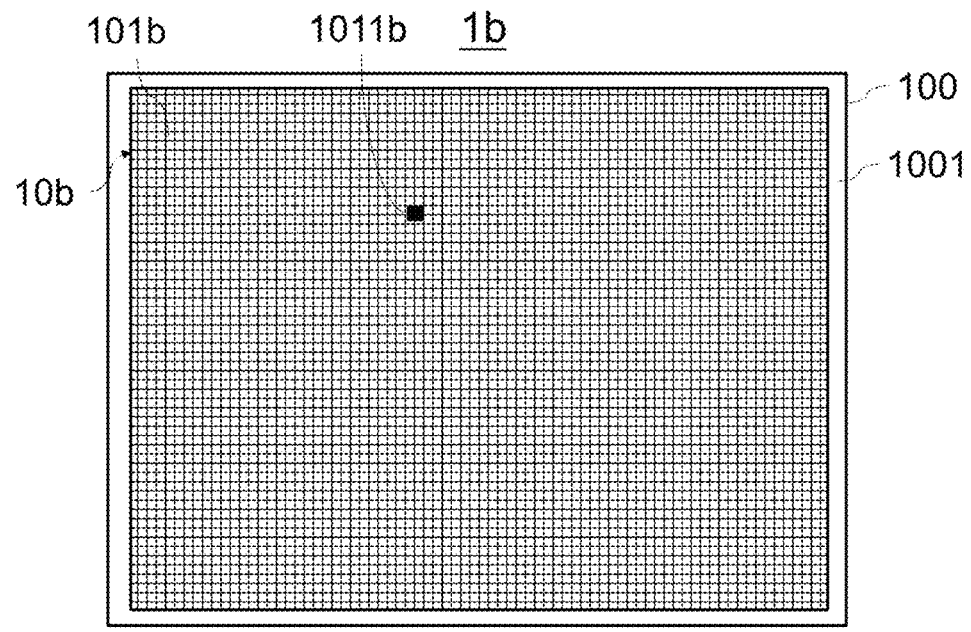
FIG. 2A is a schematic plan view illustrating a first patterned conductive layer disposed on a first surface of a substrate of a light-emitting display device according to a second embodiment of the present invention.
Figure 2B:
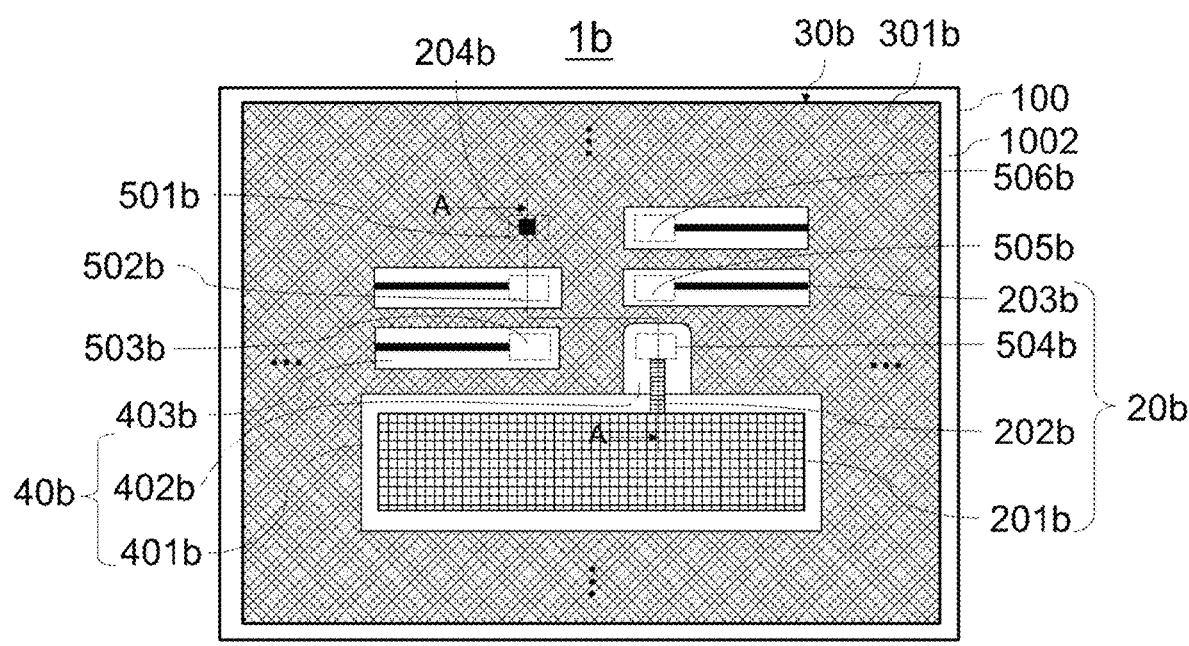
FIG. 2B is a schematic plan view illustrating a second patterned conductive layer disposed on a second surface of the substrate of the light-emitting display device according to the second embodiment of the present invention.
Figure 2C:
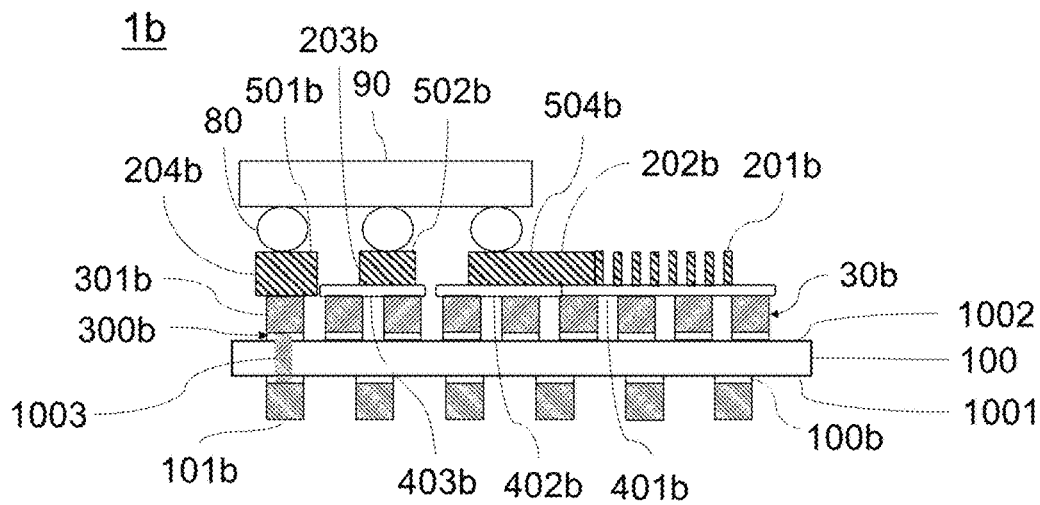
FIG. 2C is a schematic cross-sectional view illustrating A-A section of the light-emitting device of FIG. 2B manufactured in one process.

Referring to FIGS. 2A to 2C, in the second embodiment, the light-emitting display device 1b includes a substrate 100, six soldering pad regions including the first soldering pad region 501b to the sixth soldering pad region 506b that are separated and electrically isolated from each other on the substrate 100, and a plurality of passive light-emitting assemblies 90. The following describes only the differences between this embodiment and the first embodiment.

Referring to FIGS. 2B and 2C, in this embodiment, a first patterned conductive layer 10b is disposed on the first surface 1001, and a third patterned conductive layer 30b, a patterned electrically insulative layer 40b and a second patterned conductive layer 20b are sequentially disposed on top of the second surface 1002 from bottom to top. The patterned electrically insulative layer 40b is disposed between the third patterned conductive layer 30b and the second patterned conductive layer 20b to electrically isolate the second patterned conductive layer 20b and the third patterned conductive layer 30b. The second patterned conductive layer 20b includes the first soldering pad region 501b to the sixth soldering pad region 506b, and the soldering pad regions excluding the first soldering pad region 501b are located on the patterned electrically insulative layer 40b. In this embodiment, the first soldering pad region 501b that is correspondingly electrically connected to the input voltage pin of the passive light-emitting assembly 90 is directly connected to the third grid wiring 301b. The fourth soldering pad region 504b that is correspondingly electrically connected to the ground pin of the passive light-emitting assembly 90 is electrically connected to the second grid wiring 201b by means of the linear extension 202b. The second soldering pad region 502b, the third soldering pad region 503b, the fifth soldering pad region 505b and the sixth soldering pad region 506b that are correspondingly electrically connected to the data signal input pin, the clock signal input pin, the clock signal output pin, and the data signal output pin of the passive light-emitting assembly 90 are each electrically connected to a first slender wire 203b. The third grid wirings 301b are in the multiple-grid shape and are formed in the third patterned conductive layer 30b. The third gird wirings 301b may occupy 70% to 90% of the area of the second surface 1002. A portion of the third grid wiring 301b, which may be a grid node for example, is electrically connected to the grid node 1011b of the first grid wiring 101b by means of one of the through holes 1003. The second grid wiring 201b, the second grid wiring extension 202b and the first slender wire 203b are all formed in the second patterned conductive layer 20b. The extension 202b is connected to the fourth soldering pad region 504b at one end and connected to a grid node of the second grid wiring 201b at the other end. Furthermore, the second patterned conductive layer 20b is also formed with an island 204b separated from the second grid wiring 201b and the first slender wire 203b. The island 204b is electrically connected to the third grid wiring 301b. As shown in FIG. 2C, the light-emitting display device 1b may be further formed with a first patterned conductive metallic seed layer 100b on the first surface 1001. The first patterned conductive metallic seed layer 100b has the same patterns as that of the first grid wiring 101b of the first patterned conductive layer 10b to be served as a preparation layer for the first patterned conductive layer 10b. Similarly, the light-emitting display device 1b may be further formed with a third patterned conductive metallic seed layer 300b on the second surface 1002. The third patterned conductive metallic seed layer 300b has the same patterns as that of the third grid wiring 301b of the third patterned conductive layer 30b to be served as a preparation layer for the third patterned conductive layer 30b. Other details the same as that in the foregoing embodiments are not repeated herein.

In this embodiment, the patterned electrically insulative layer 40b has a plurality of first electrically insulative segments 401b, a plurality of second electrically insulative segments 402b and a plurality of third electrically insulative segments 403b. Each of the first electrically insulative segments 401b covers a configuration area on the third patterned conductive layer 30b corresponding to the second grid wiring 201b to isolate the electrical contact between the second grid wiring 201b and the third grid wiring 301b. Each of the second electrically insulative segments 402b covers a configuration area on the third patterned conductive layer 30b corresponding to the second grid wiring extension 202b and the soldering pad region 504b to isolate the electrical contact between the second grid wiring extension 202b, the soldering pad region 504b and the third grid wiring 301b. Each of the third electrically insulative segments 403b covers a configuration area on the third patterned conductive layer 30b corresponding to each of the first slender wires 203b including the portion connecting the soldering pad region to isolate the electrical contact between the first slender wire 203b and the third grid wiring 301b. The portion of the third grid wiring 301b that is electrically connected to the first grid wiring 101b by means of one of the through holes 1003 is exposed from the patterned electrically insulative layer 40b and is directly contacted and electrically connected to the island 204b of the second patterned conductive layer 20b.

Figure 2D:
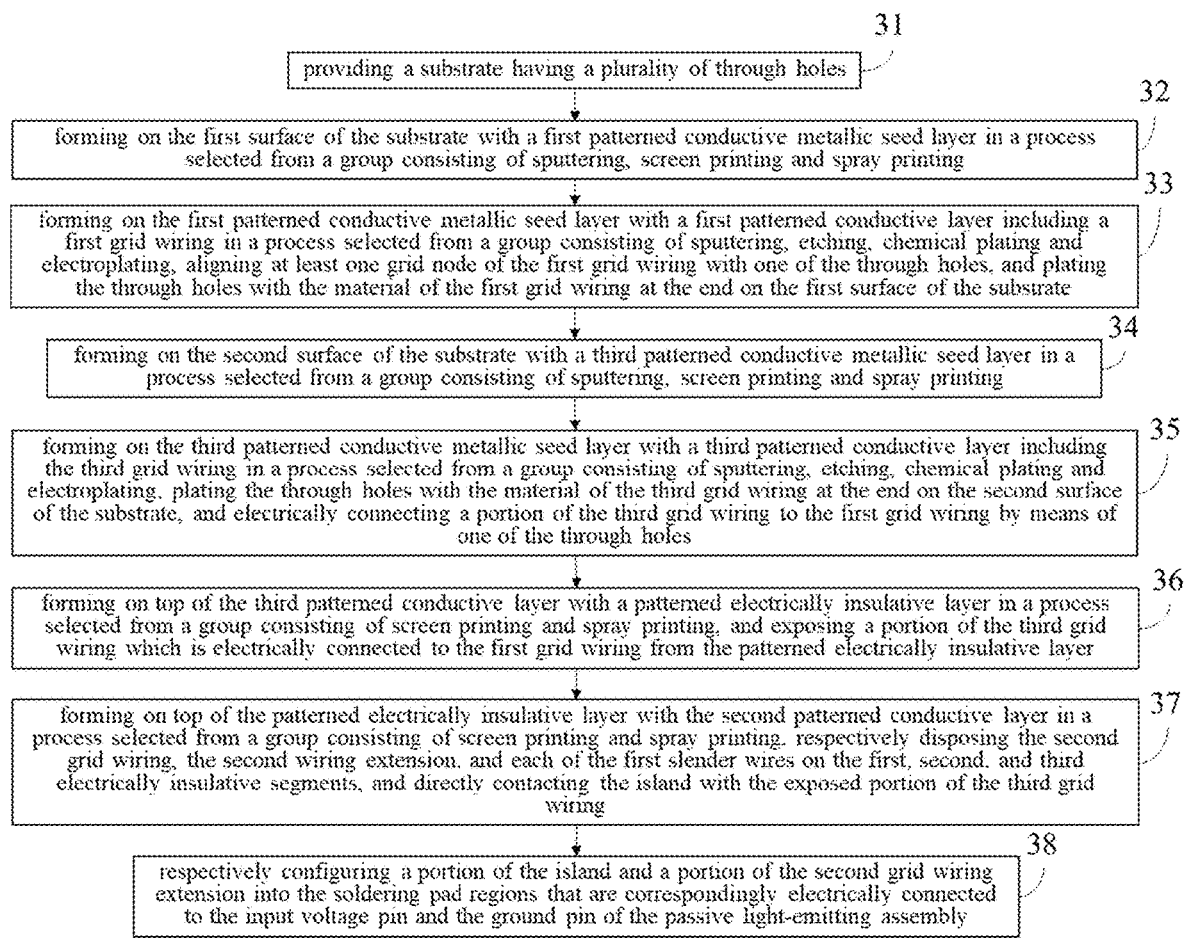
FIG. 2D is a flow chart illustrating a method of manufacturing the light-emitting device of FIG. 2C.

In one embodiment, the manufacturing method of the light-emitting display device of FIG. 2C includes steps 31 to 38 in FIG. 2D, wherein steps 31 to 33 are the same as steps 11 to 13 in FIG. 1D, and steps 34 to 38 are described in the following referring to FIGS. 2A to 2C.

Step 34: Forming on the second surface 1002 of the substrate 100 with a third patterned conductive metallic seed layer 300b in a process selected from a group consisting of sputtering, screen printing and spray printing.

Step 35: Forming on the third patterned conductive metallic seed layer 300b with a third patterned conductive layer 30b including the third grid wirings in multiple-grid shape in a process selected from a group consisting of sputtering, etching, chemical plating and electroplating, and plating the through holes 1003, already been plated with the material of the first grid wiring 101b, with the material of the third grid wiring 301b at the end on the second surface 1002 of the substrate 100, and electrically connecting a portion of the third grid wiring 301b to the first grid wiring 101b by means of one of the through holes 1003. The third patterned conductive layer 30b includes the third grid wiring 301b. Third grid wiring 301b has the same patterns as that of the third patterned conductive metallic seed layer 300b. The third grid wiring 301b and the first grid wiring 101b may be made in same or varied materials.

Step 36: Forming a patterned electrically insulative layer 40b including the first, second and third electrically insulative segments 401b, 402b, 403b on top of the third patterned conductive layer 30b in a process selected from a group consisting of screen printing and spray printing, and exposing a portion of the third grid wiring 301b which is electrically connected to the first grid wiring 101b by means of one of the through holes 1003 from the patterned electrically insulative layer 40b. The first, second and third electrically insulative segments may be formed in one single process.

Step 37: Forming on top of the patterned electrically insulative layer 40b with the second patterned conductive layer 20b including the second grid wiring 201b, the second grid wiring extension 202b, the first slender wire 203b and the island 204b in a process selected from a group consisting of screen printing and spray printing, and disposing the second grid wiring 201b on the first electrically insulative segment 401b, and disposing the extension 202b on the second electrically insulative segment 402b, and disposing each of the first slender wires 203b on the third electrically insulative segment 403b, and directly contacting the island 204b with the exposed portion of the third grid wiring 301b from the patterned electrically insulative layer 40b.

Step 38: Configuring a portion of the island 204b and a portion of the extension 202b of the second grid wiring into the soldering pad region 501b and the soldering pad region 504b that are correspondingly electrically connected to the input voltage pin and the ground pin of the passive light-emitting assembly 90, respectively. Furthermore, configuring respective portions of the first slender wires 203b into the second soldering pad region 502b, the third soldering pad region 503b, the fifth soldering pad region 505b and the sixth soldering pad region 506b that are correspondingly electrically connected to the data signal input pin, the clock signal input pin, the clock signal output pin and the data signal output pin of the passive light-emitting assembly 90, respectively. Since the second patterned conductive layer 20b is formed by screen printing or spray printing, the island 204b and the first soldering pad region 501b are integrated, the extension 202b and the fourth soldering pad region 504b are integrated, and the respective portions of the first slender wires 203b are integrated with the second soldering pad region 502b, the third soldering pad region 503b, the fifth soldering pad region 505b and the sixth soldering pad region 506b, respectively.

As shown in FIG. 2E, in another embodiment, a light-emitting display device 1b' is the same as that in FIG. 2C except that the third patterned conductive metallic seed layer 300b may be excluded. The detail descriptions with respect to those features already shown in FIG. 2C will not be repeated. The method of manufacturing the light-emitting display device of FIG. 2E includes steps 41 to 47 in FIG. 2F, wherein step 44 replaces steps 34 and 35 in FIG. 2D, while the other steps are the same as the others in FIG. 2D.

Step 44: Forming on the second surface 1002 of the substrate 100 with a third patterned conductive layer 30b including the third grid wirings 301b in a process selected from a group consisting of screen printing and spray printing, and filling the through holes 1003, which have already been plated with the material of the first grid wiring 101b, with the material of the third grid wiring 301b at the end on the second surface 1002 of the substrate 100, and electrically connecting a portion of the third grid wirings 301b with the first grid wiring 101b by means of one of the through holes 1003. The third grid wiring 301b and the first grid wiring 101b may be made in same or varied materials.

Figures 2G, 2H:
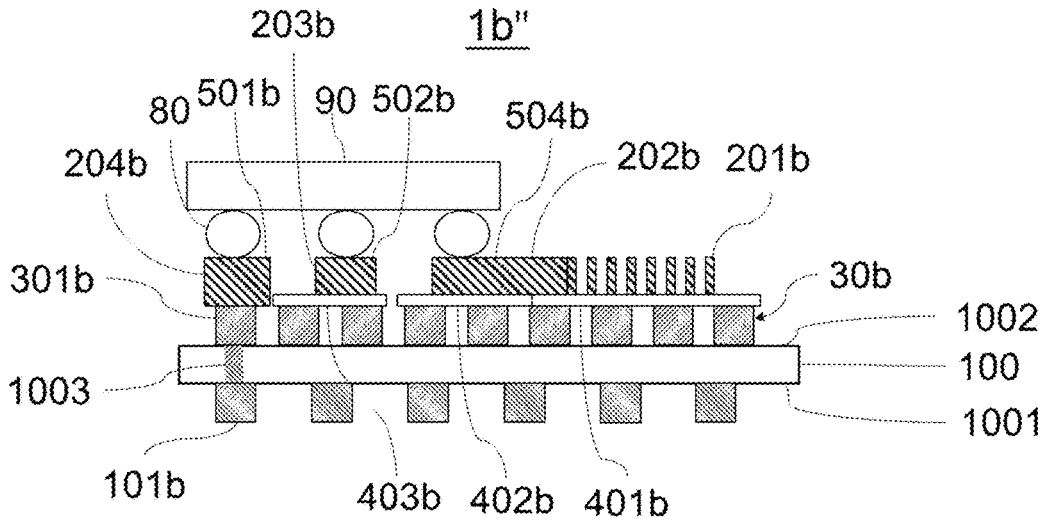
FIG. 2G is a schematic cross-sectional view illustrating A-A section of the light-emitting device of FIG. 2B manufactured in still another process.
FIG. 2H is a flow chart illustrating a method of manufacturing the light-emitting device of FIG. 2G.

As shown in FIG. 2G, in still another embodiment, a light-emitting display device 1b" is the same as that in FIG. 2E except that the first patterned conductive metallic seed layer 100b may be excluded. The detail descriptions with respect to those features already shown in FIG. 2E will not be repeated. The method of manufacturing the light-emitting display device of FIG. 2G includes steps 51 to 56 in FIG. 2H, wherein step 52 replaces steps 42 and 43 in FIG. 2F, while the other steps are the same as the others in FIG. 2F.

Step 52: Forming on the first surface 1001 of the substrate 100 with a first patterned conductive layer 10b including a first grid wiring 101b in a process selected from a group consisting of screen printing and spray printing. Aligning at least one grid node of the first grid wiring with a through hole 1003 and filling the through hole 1003 with the material of the first grid wiring 101b at the end on the first surface 1001 of the substrate 100.

Figure 3A:
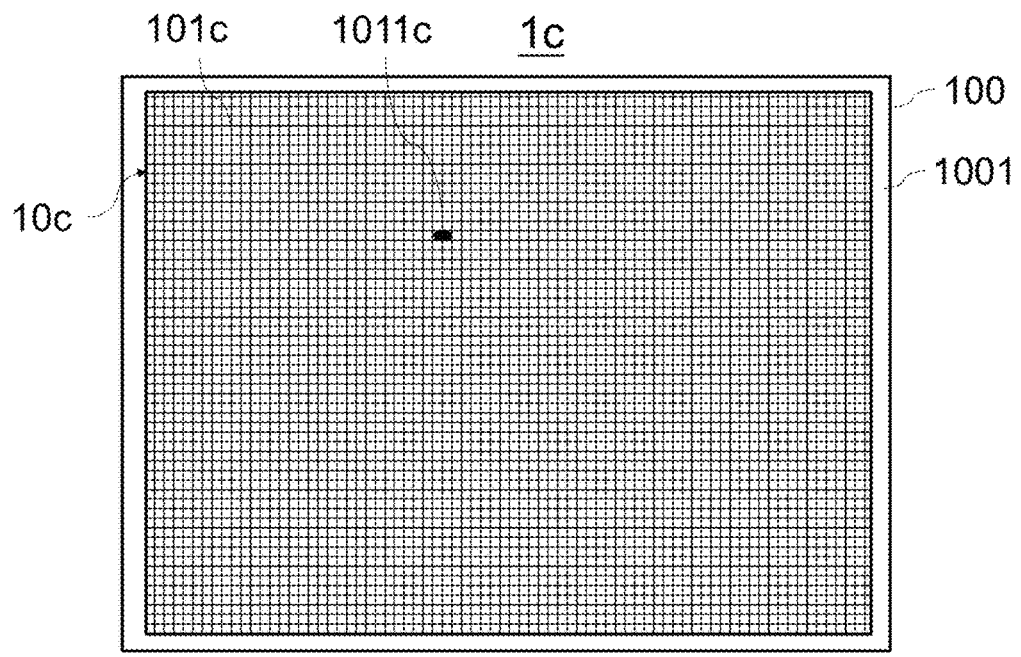
FIG. 3A is a schematic plan view illustrating a first patterned conductive layer disposed on a first surface of a substrate of a light-emitting display device according to a third embodiment of the present invention.
Figure 3B:
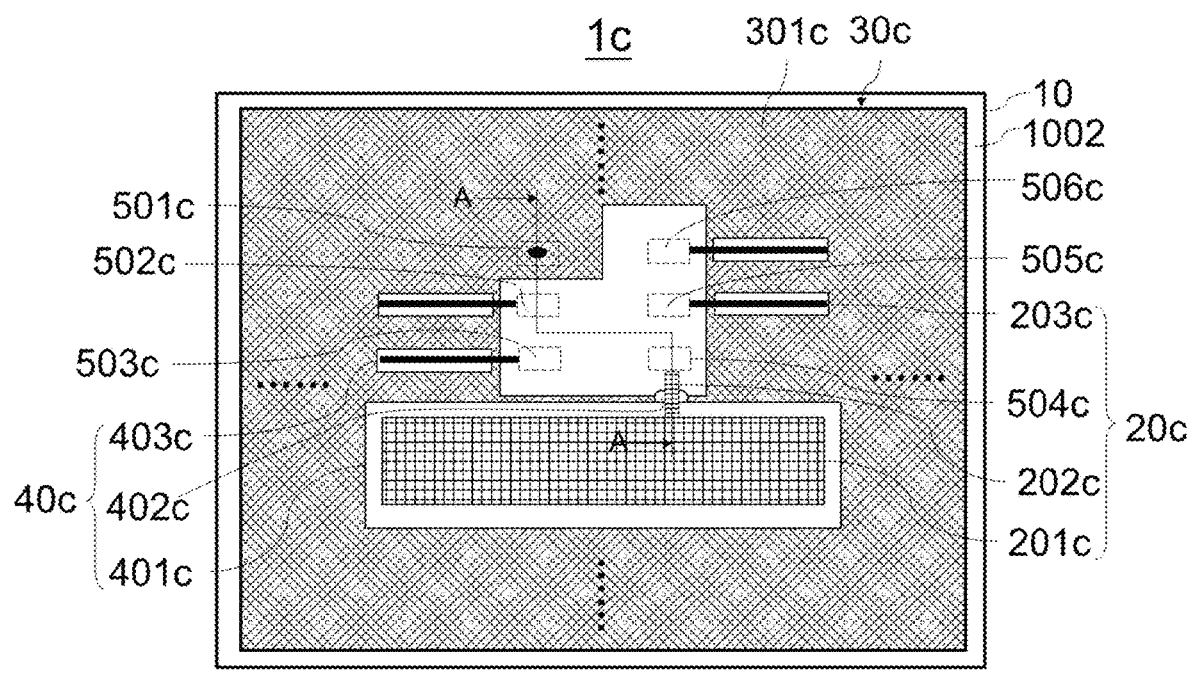
FIG. 3B is a schematic plan view illustrating a second patterned conductive layer disposed on a second surface of the substrate of the light-emitting display device according to the third embodiment of the present invention.
Figure 3C:
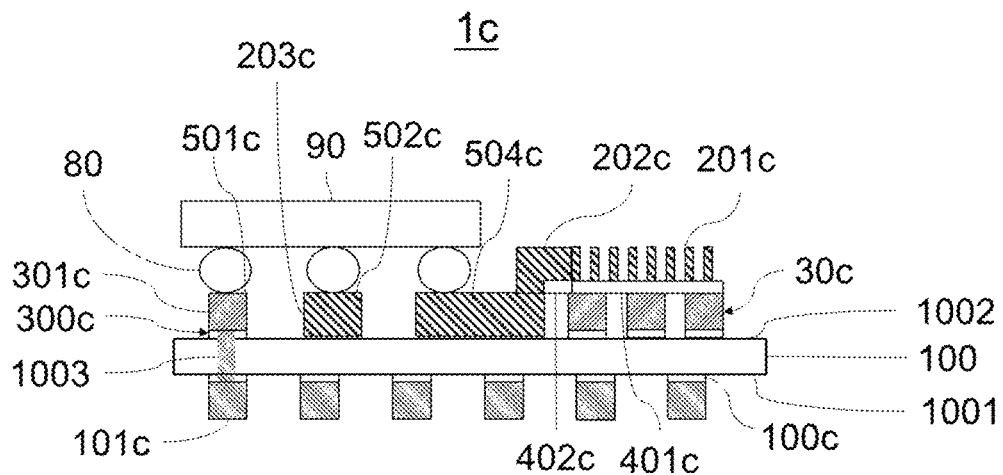
FIG. 3C is a schematic cross-sectional view illustrating A-A section of the light-emitting device of FIG. 3B manufactured in one process.

Referring to FIGS. 3A to 3C, in the third embodiment, the light-emitting display device 1c includes a substrate 100, six soldering pad regions including the first soldering pad region 501c to the sixth soldering pad region 506c that are separated and electrically isolated from each other on the substrate 100, and a plurality of passive light-emitting assemblies 90. The following describes only the differences between this embodiment and the second embodiment.

Referring to FIGS. 3B and 3C, in this embodiment, a first patterned conductive layer 10c is disposed on the first surface 1001, and a third patterned conductive layer 30c, a patterned electrically insulative layer 40c and a second patterned conductive layer 20c are sequentially disposed on top of the second surface 1002 from bottom to top. The patterned electrically insulative layer 40c is disposed between the third patterned conductive layer 30c and the second patterned conductive layer 20c to electrically isolate the second patterned conductive layer 20c and the third patterned conductive layer 30c. The second patterned conductive layer 20c includes the first soldering pad region 501c to the sixth soldering pad region 506c, and the soldering pad regions except the first soldering pad region 501c are located on the second patterned conductive layer 20c disposed on the second surface 1002. In this embodiment, the first soldering pad region 501c that is correspondingly electrically connected to the input voltage pin of the passive light-emitting assembly 90 is directly connected to the third grid wiring 301c and is electrically connected with the first grid wiring 101c by means of the through hole 1003. The fourth soldering pad region 504c that is correspondingly electrically connected to the ground pin of the passive light-emitting assembly 90 is electrically connected to the second grid wiring 201c by means of the linear extension 202c of the second grid wiring. The second soldering pad region 502c, the third soldering pad region 503c, the fifth soldering pad region 505c and the sixth soldering pad region 506c that are correspondingly electrically connected to the data signal input pin, the clock signal input pin, the clock signal output pin, and the data signal output pin of the passive light-emitting assembly 90 are each electrically connected to a first slender wire 203c. The third grid wirings 301c are in the multiple-grid shape and are formed in the third patterned conductive layer 30c, occupying 70% to 90% of the area of the second surface 1002. A portion of the third grid wiring 301c, which may be a grid node for example, is electrically connected to the grid node 1011c of the first grid wiring 101c by means of one of the through holes 1003. The first grid wirings 101c are formed in the first patterned conductive layer 10c and have a multiple-grid shape, occupying 70% to 90% of the area of the first surface 1001 of the substrate 100. The second grid wiring 201c, the second grid wiring extension 202c and the first slender wire 203c are all formed in the second patterned conductive layer 20c. The extension 202c is connected to the fourth soldering pad region 504c at one end and connected to a grid node of the second grid wiring 201c at the other end. As shown in FIG. 3C, the light-emitting display device 1c may be further formed with a first patterned conductive metallic seed layer 100c on the first surface 1001. The first patterned conductive metallic seed layer 100c has the same patterns as that of the first grid wiring 101c of the first patterned conductive layer 10c to be served as a preparation layer for the first patterned conductive layer 10c. Similarly, the light-emitting display device 1c may be further formed with a third patterned conductive metallic seed layer 300c on the second surface 1002. The third patterned conductive metallic seed layer 300c has the same patterns as that of the third grid wiring 301c of the third patterned conductive layer 30c to be served as a preparation layer for the third patterned conductive layer 30c. Other details the same as that in the foregoing embodiments are not repeated herein.

In this embodiment, the patterned electrically insulative layer 40c has a plurality of first electrically insulative segments 401c, a plurality of second electrically insulative segments 402c and a plurality of third electrically insulative segments 403c. Each of the first electrically insulative segments 401c covers a configuration area on the third patterned conductive layer 30c corresponding to the second grid wiring 201c to isolate the electrical contact between the second grid wiring 201c and the third grid wiring 301c. Each of the second electrically insulative segments 402c covers a configuration area on the third patterned conductive layer 30c corresponding to at least the part of the extension 202c connecting the second grid wiring 201c to isolate the electrical contact between the part of the extension 202c connecting the second grid wiring 201c and the third grid wiring 301c. Each of the third electrically insulative segments 403c covers a configuration area on the third patterned conductive layer 30c corresponding to each of the first slender wires 203c excluding the soldering pad region connecting portion to isolate the electrical contact between the first slender wire 203c and the third grid wiring 301c. The portion of the third grid wiring 301c that is electrically connected to the first grid wiring 101c by means of one of the through holes 1003 is exposed from the patterned electrically insulative layer 40c. All the soldering pad regions are exposed from the patterned electrically insulative layer 40c.

Figure 3D:
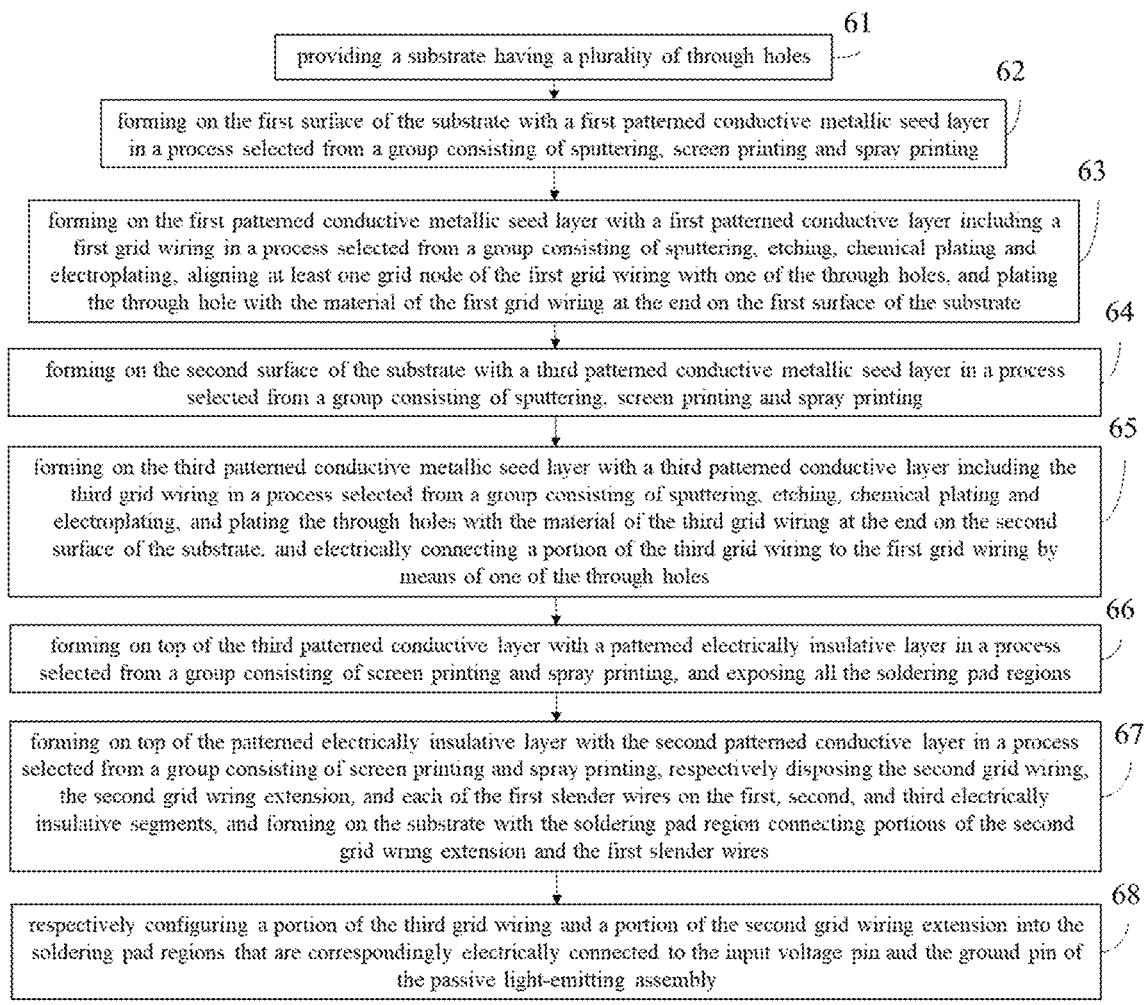
FIG. 3D is a flow chart illustrating a method of manufacturing the light-emitting device of FIG. 3C.

In one embodiment, the manufacturing method of the light-emitting display device of FIG. 3C includes steps 61 to 68 in FIG. 3D, wherein steps 61 to 65 are the same as steps 31 to 35 in FIG. 2D, and steps 66 to 68 are described in the following.

Step 66: This step distinguishes the step 36 in that all the soldering pad regions are exposed from the patterned electrically insulative layer. As shown in FIGS. 3B and 3C, a portion of the third grid wiring 301c which is electrically connected to the first grid wiring 101c by means of one of the through holes 1003 is exposed from the patterned electrically insulative layer 40c. In addition, all the soldering pad regions 501c to 506c are exposed from the patterned electrically insulative layer 40c.

Step 67: Forming on top of the patterned electrically insulative layer 40c with the second patterned conductive layer 20c including the second grid wiring 201c, the second grid wiring extension 202c, and at least two of the first slender wire 203c in a process selected from a group consisting of screen printing and spray printing, and disposing the second grid wiring 201c on the first electrically insulative segment 401c, and disposing the extension 202c excluding the soldering pad region connecting portions on the second electrically insulative segment 402c, and disposing each of the first slender wires 203c excluding the soldering pad region connecting portions on the third electrically insulative segment 403c, and forming the soldering pad region connecting portions of the extension 202c and the first slender wires 203c on the substrate 100.

Step 68: Configuring a portion of the third grid wiring 301c and a portion of the extension 202c of the second grid wiring into the soldering pad region 501c and the soldering pad region 504c that are correspondingly electrically connected to the input voltage pin and the ground pin of the passive light-emitting assembly 90, respectively. Since the second patterned conductive layer 20c is formed by screen printing or spray printing, the extension 202c and the fourth soldering pad region 504c are integrated, and the respective portions of the first slender wires 203c are integrated with the second soldering pad region 502c, the third soldering pad region 503c, the fifth soldering pad region 505c and the sixth soldering pad region 506c, respectively.

Figure 3E:
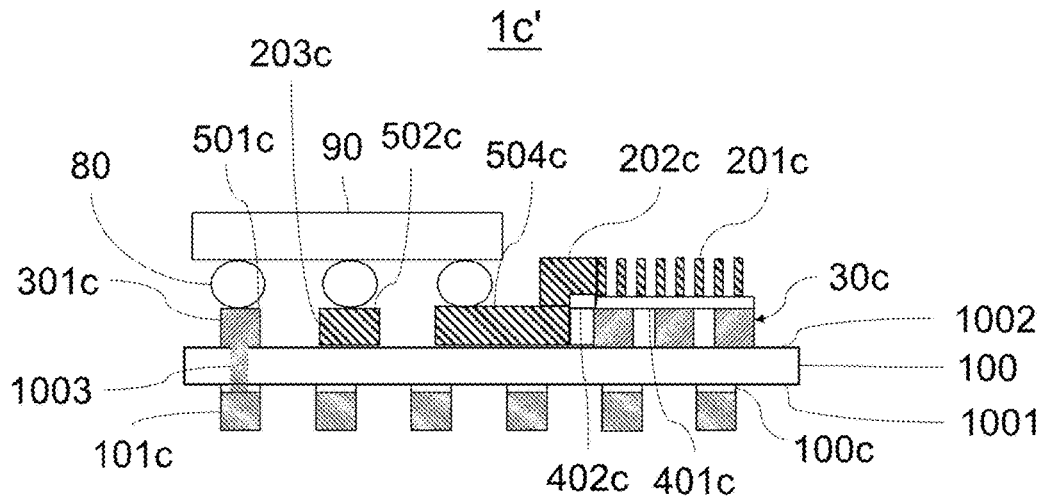
FIG. 3E is a schematic cross-sectional view illustrating A-A section of the light-emitting device of FIG. 3B manufactured in another process.
Figure 3F:
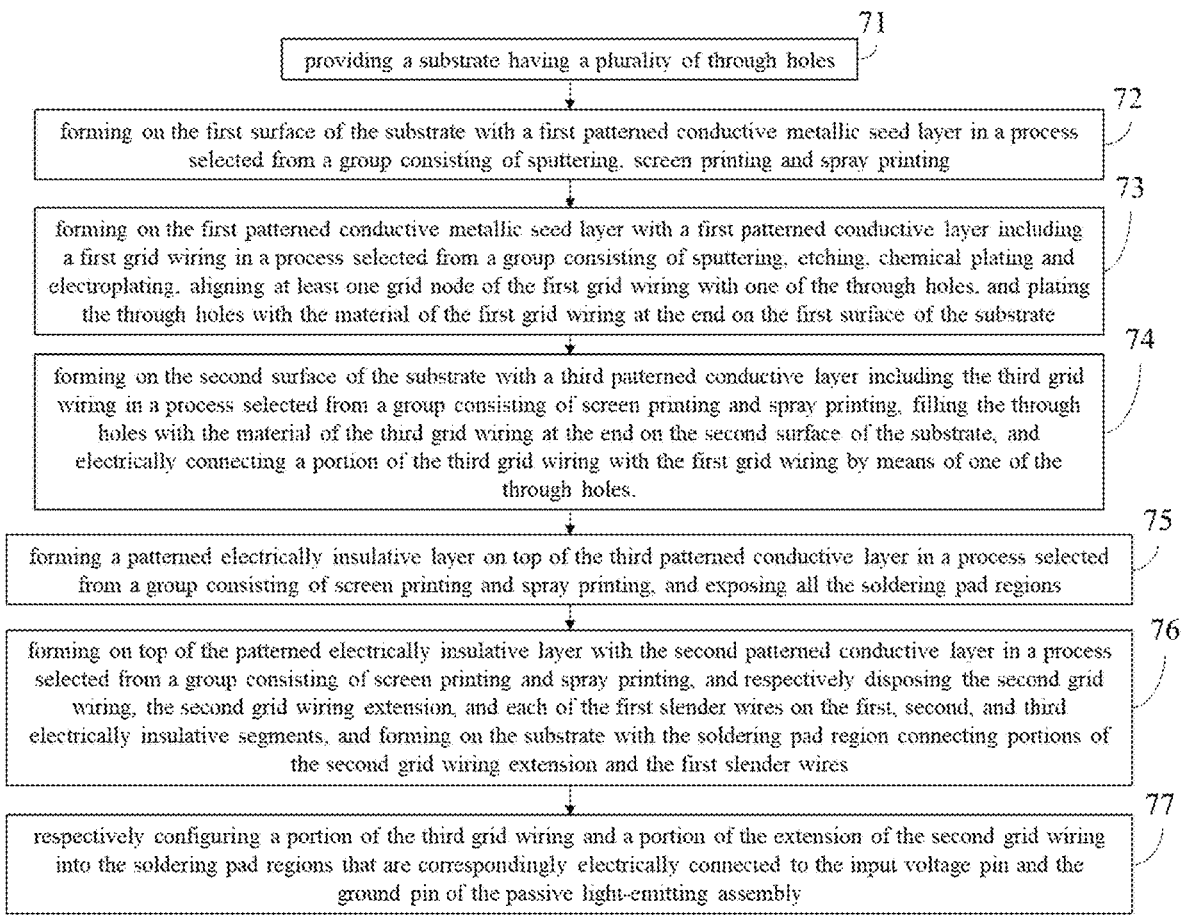
FIG. 3F is a flow chart illustrating a method of manufacturing the light-emitting device of FIG. 3E.

As shown in FIG. 3E, in another embodiment, a light-emitting display device 1c' is the same as that in FIG. 3C except that the third patterned conductive metallic seed layer 300c may be excluded. The detail descriptions with respect to those features already shown in FIG. 3C will not be repeated. The method of manufacturing the light-emitting display device of FIG. 3E includes steps 71 to 77 in FIG. 3F, wherein step 74 replaces steps 64 and 65 in FIG. 3D, while the other steps are the same as the others in FIG. 3D.

Figure 3G:
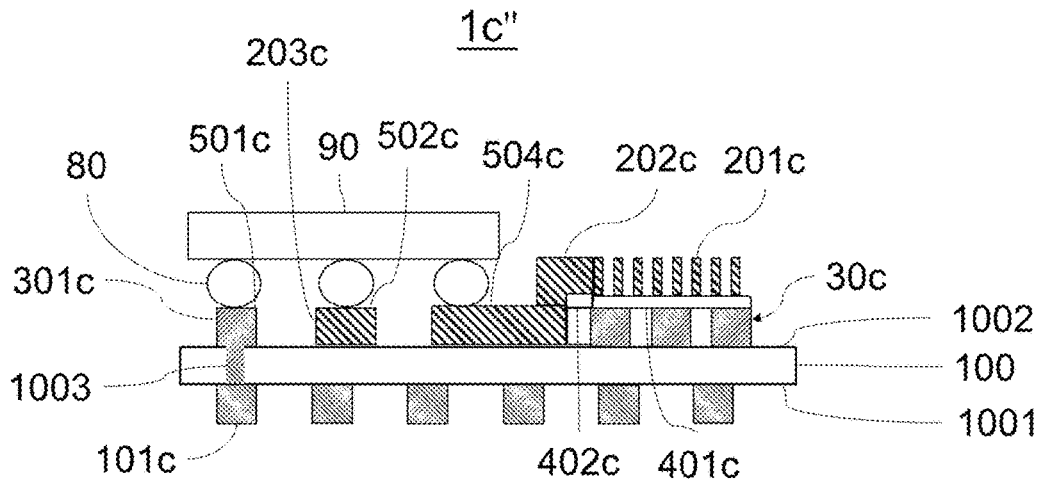
FIG. 3G is a schematic cross-sectional view illustrating A-A section of the light-emitting device of FIG. 3B manufactured in still another process.
Figure 3H:
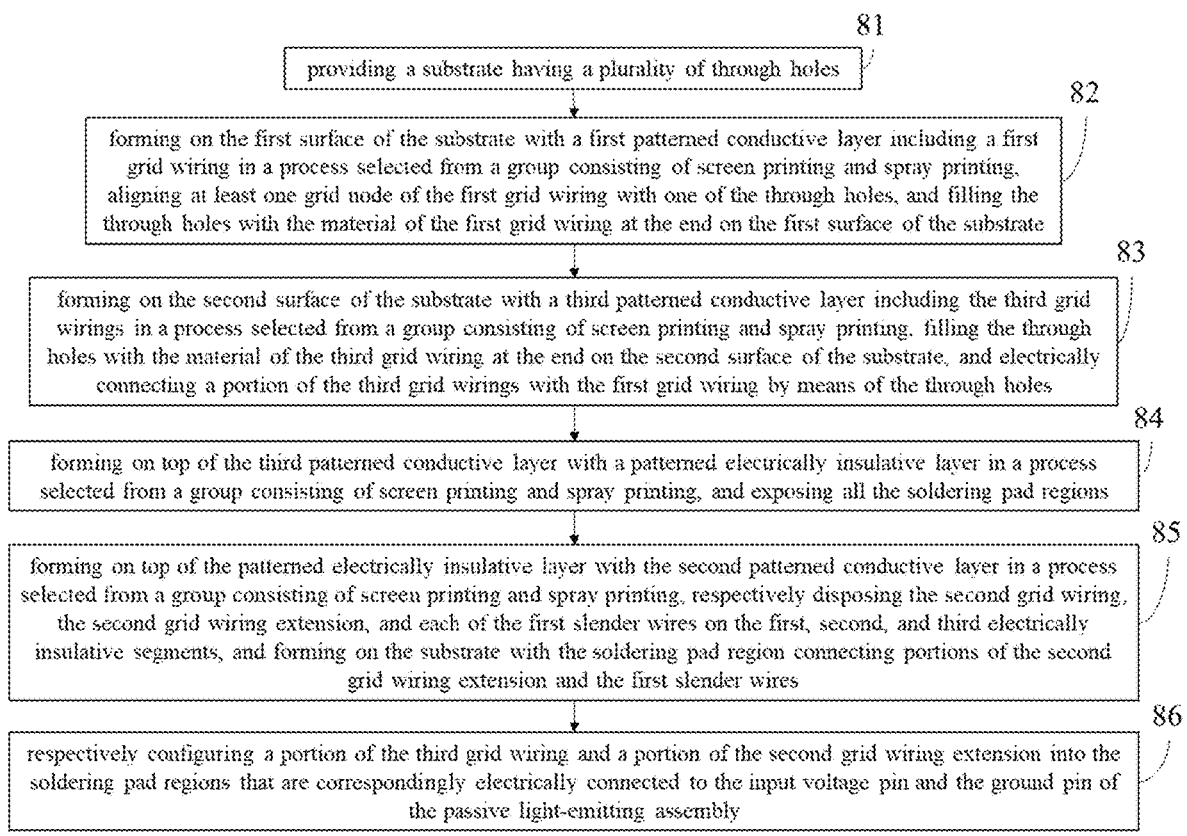
FIG. 3H is a flow chart illustrating a method of manufacturing the light-emitting device of FIG. 3G.

As shown in FIG. 3G, in still another embodiment, a light-emitting display device 1c' is the same as that in FIG. 3E except that the first patterned conductive metallic seed layer 100c may be excluded. The detail descriptions with respect to those features already shown in FIG. 3E will not be repeated. The method of manufacturing the light-emitting display device of FIG. 3G includes steps 81 to 86 in FIG. 3H, wherein step 82 replaces steps 72 and 73 in FIG. 3F, while the other steps are the same as the others in FIG. 3F.

Figure 4A:
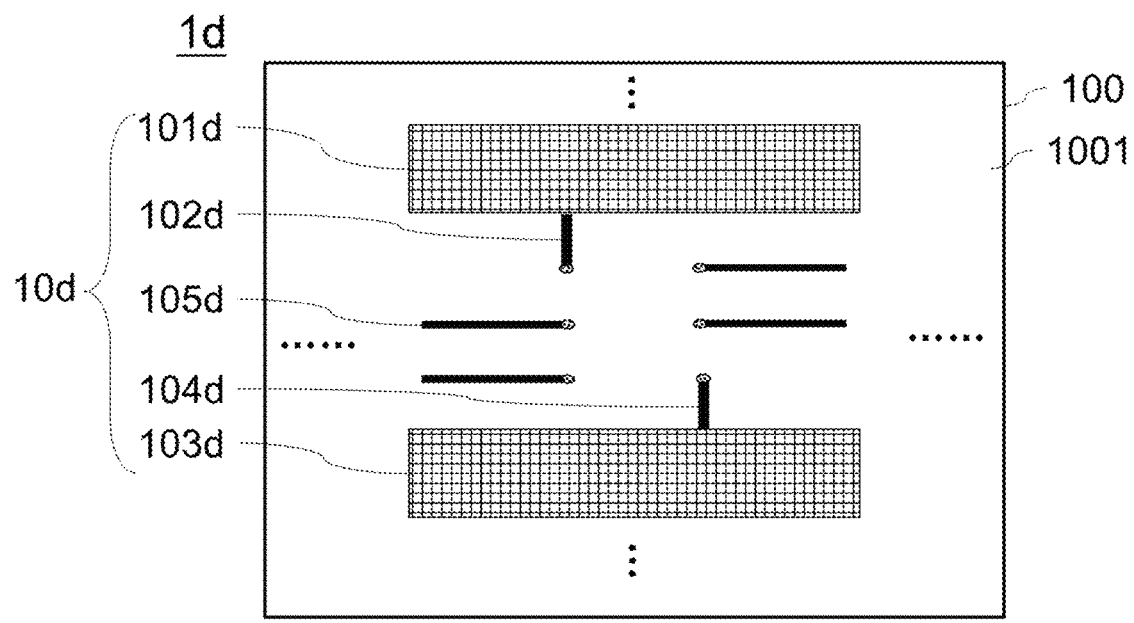
FIG. 4A is a schematic plan view illustrating a first patterned conductive layer disposed on a first surface of a substrate of a light-emitting display device according to a fourth embodiment of the present invention.
Figure 4B:
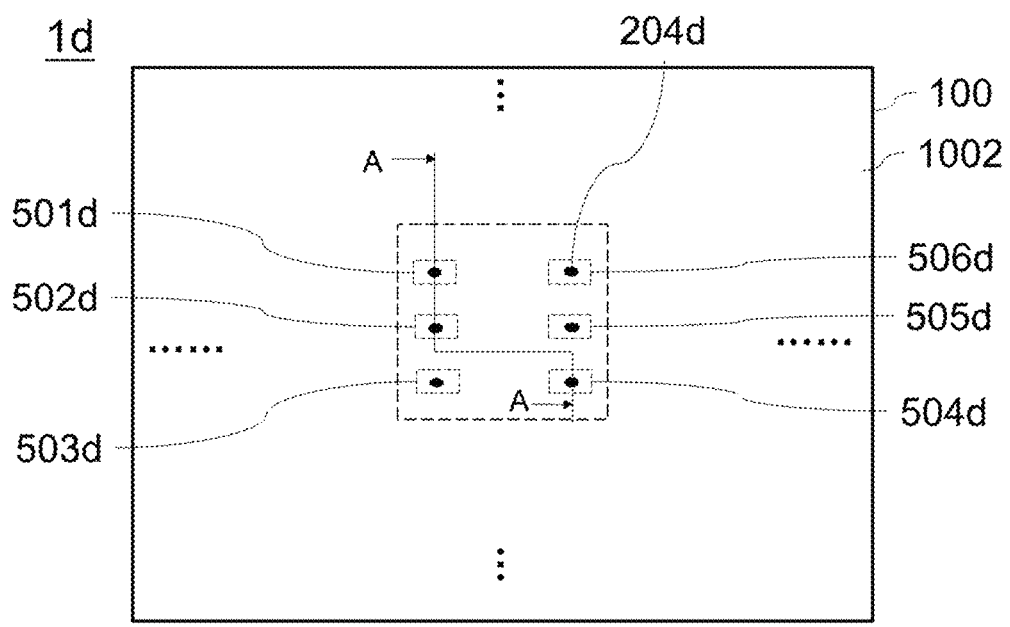
FIG. 4B is a schematic plan view illustrating a second patterned conductive layer disposed on a second surface of the substrate of the light-emitting display device according to the fourth embodiment of the present invention.
Figure 4C:
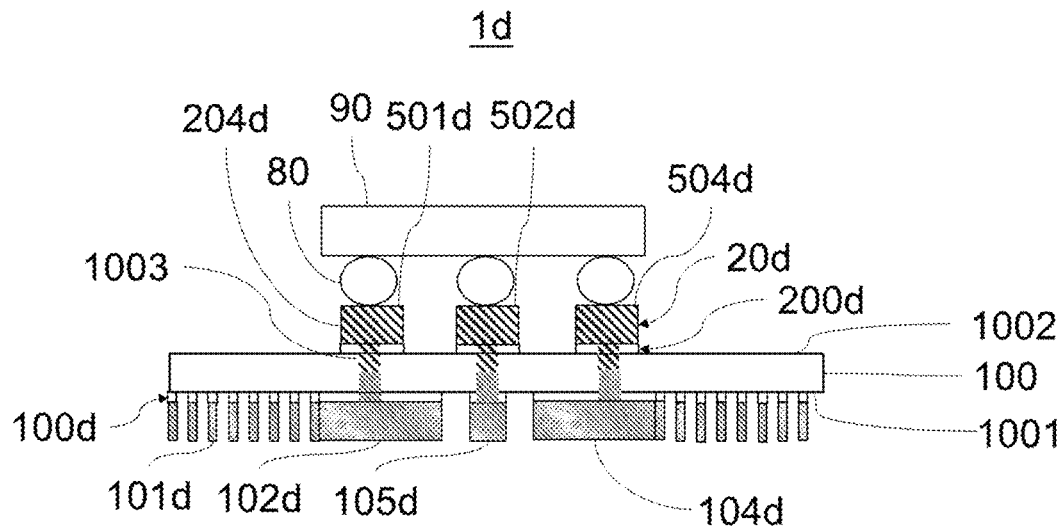
FIG. 4C is a schematic cross-sectional view illustrating A-A section of the light-emitting device of FIG. 4B manufactured in one process.

Referring to FIGS. 4A to 4C, in the fourth embodiment, the light-emitting display device 1d includes a substrate 100, six soldering pad regions including the first soldering pad region 501d to the sixth soldering pad region 506d that are separated and electrically isolated from each other on the substrate 100, and a plurality of passive light-emitting assemblies 90. The following describes only the differences between this embodiment and the above-mentioned embodiments.

Referring to FIGS. 4B and 4C, in this embodiment, a first patterned conductive layer 10d is disposed on the first surface 1001, and a second patterned conductive layer 20d is disposed on top of the second surface 1002. The second patterned conductive layer 20d includes the first soldering pad region 501d to the sixth soldering pad region 506d and a plurality of islands 204d respectively corresponding to the first soldering pad region 501d to the sixth soldering pad region 506d. On the other hand, the island 204d on the first soldering pad region 501d that is correspondingly electrically connected to the input voltage pin of the passive light-emitting assembly 90 is electrically connected to a liner extension 102d of the first grid wiring 101d by means of one through hole 1003 and is therefore electrically connected with the first grid wiring 101d. The island 204d on the fourth soldering pad region 504d that is correspondingly electrically connected to the ground pin of the passive light-emitting assembly 90 is electrically connected to the linear extension 104d of the second grid wiring 103d by means of one through hole 1003 and is therefore electrically connected with the second grid wiring 103d. The islands 204d on the second soldering pad region 502d, the third soldering pad region 503b, the fifth soldering pad region 505b and the sixth soldering pad region 506b that are correspondingly electrically connected to the data signal input pin, the clock signal input pin, the clock signal output pin and the data signal output pin of the passive light-emitting assembly 90 are each electrically connected to a linear first slender wire 105d by means of one through hole 1003. In this embodiment, the first grid wiring 101d, the extension 102d of the first grid wiring, the second grid wiring 103d, the extension 104d of the second grid wiring, and the first slender wires 105d are all formed in the first patterned conductive layer 10d. The extension 102d is connected to a grid node of the first grid wiring 101d at one end. The extension 104d is connected to a grid node of the second grid wiring 103d. The extension 102d is disposed to be in parallel with the plane in which the first grid wiring 101d is arranged. The laying direction of each first slender wire 105d and each extension 102d are arranged to be crossing with each other, such as orthogonal for example. In one embodiment where only four soldering pad regions are required, the number of the first slender wires 105d may be reduced to be two.

Figure 4D:
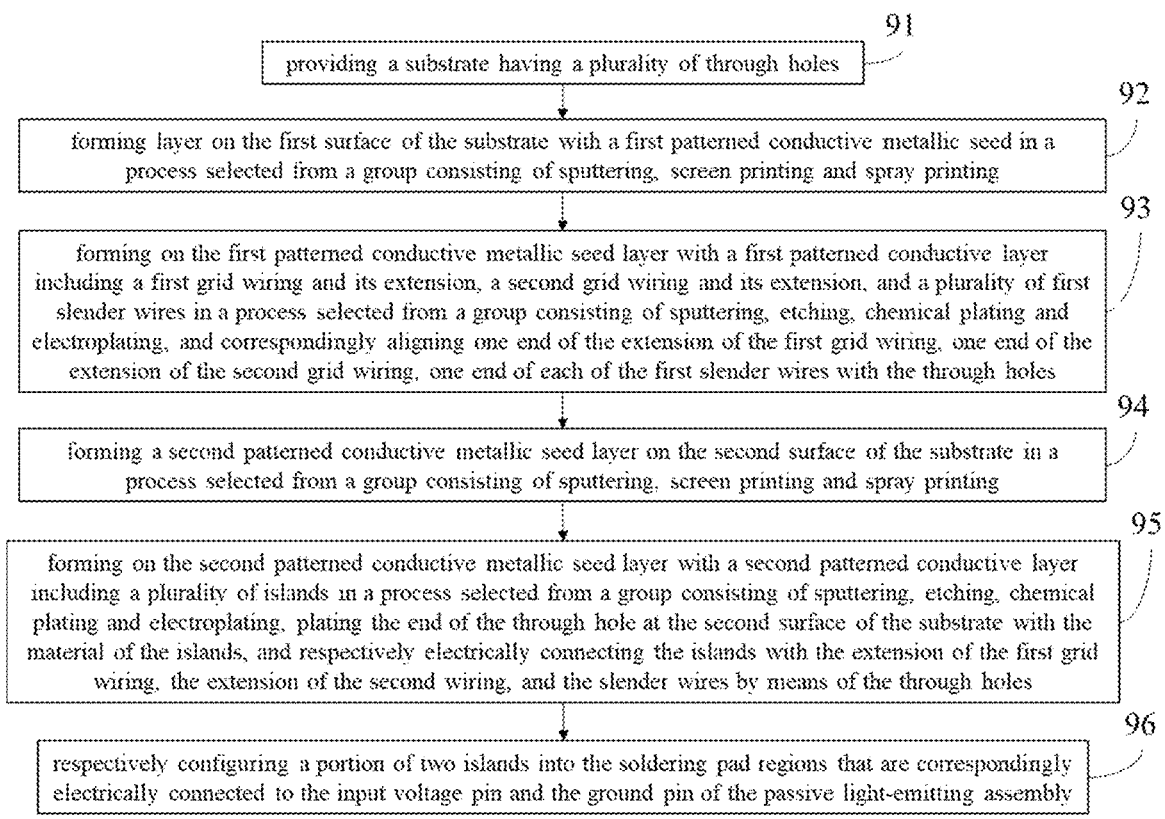
FIG. 4D is a flow chart illustrating a method of manufacturing the light-emitting device of FIG. 4C.

Referring to FIG. 4C, in one embodiment, the light-emitting display device 1d may be formed with a first patterned conductive metallic seed layer 100d and a second patterned conductive metallic seed layer 200d on the first surface 1001 and the second surface 1002 to be served as preparation layer for the first patterned conductive layer 10d and the second patterned conductive layer 20d, respectively. In one embodiment, the manufacturing method of the light-emitting display device of FIG. 4C includes steps 91 to 96 in FIG. 4D, which, except the steps 93, 95 and 96, are the same as that in FIG. 1D. Below are the details.

Step 93: Forming the first patterned conductive layer 10d including the first grid wiring 101d, the extension 102d of the first grid wiring, the second grid wiring 103d, the extension 104d of the second grid wiring, and at least two of the first slender wire 105d on the first patterned conductive metallic seed layer 100d in a process selected form a group consisting of sputtering, etching, chemical plating and electroplating, and aligning one end of the extension 102d, the extension 104d, and each first slender wire 105d with a through hole 1003. The through hole 1003 is plated with material of the extension 102d, the extension 104d, or the first slender wire 105d at one end on the first surface 1001 of the substrate 100.

Step 95: Forming the second patterned conductive layer 20d including the islands 204d on the second patterned conductive metallic seed layer 200d in a process selected from a group consisting of sputtering, etching, chemical plating and electroplating, and plating the through holes 1003 with material of the islands 204d at the end on the second surface 1002 of the substrate 100 such that the islands 204d are electrically connected with the extension 102d, the extension 104d, and the first slender wires 105d by means of the through holes 1003, respectively.

Step 96: Respectively configuring respective portions of the two islands 204d as the soldering pad regions 501d and 506d that are electrically connected to the input voltage pin and the ground pin of the passive light-emitting assembly 90.

Similarly, steps 92 and 93 or steps 94 and 95 may be replaced with the process selected from a group consisting of screen printing and spray printing, wherein the first patterned conductive metallic seed layer 100d or the second patterned conductive metallic seed layer 200d is excluded from the light-emitting display device 1d.

Figure 5A:
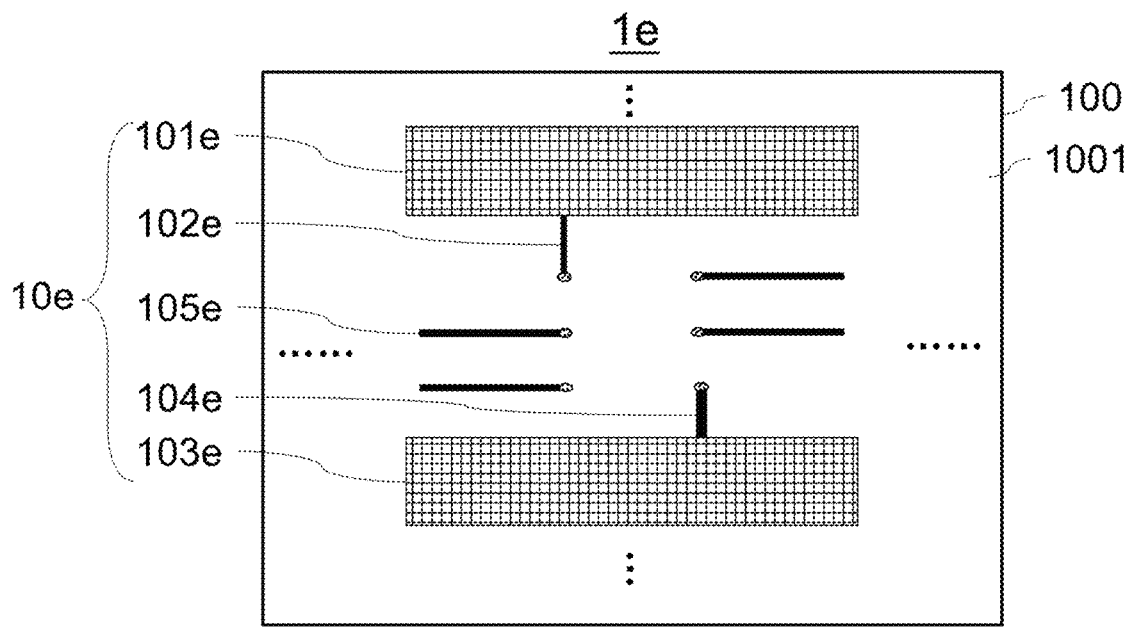
FIG. 5A is a schematic plan view illustrating a first patterned conductive layer disposed on a first surface of a substrate of a light-emitting display device according to a fifth embodiment of the present invention.
Figure 5B:
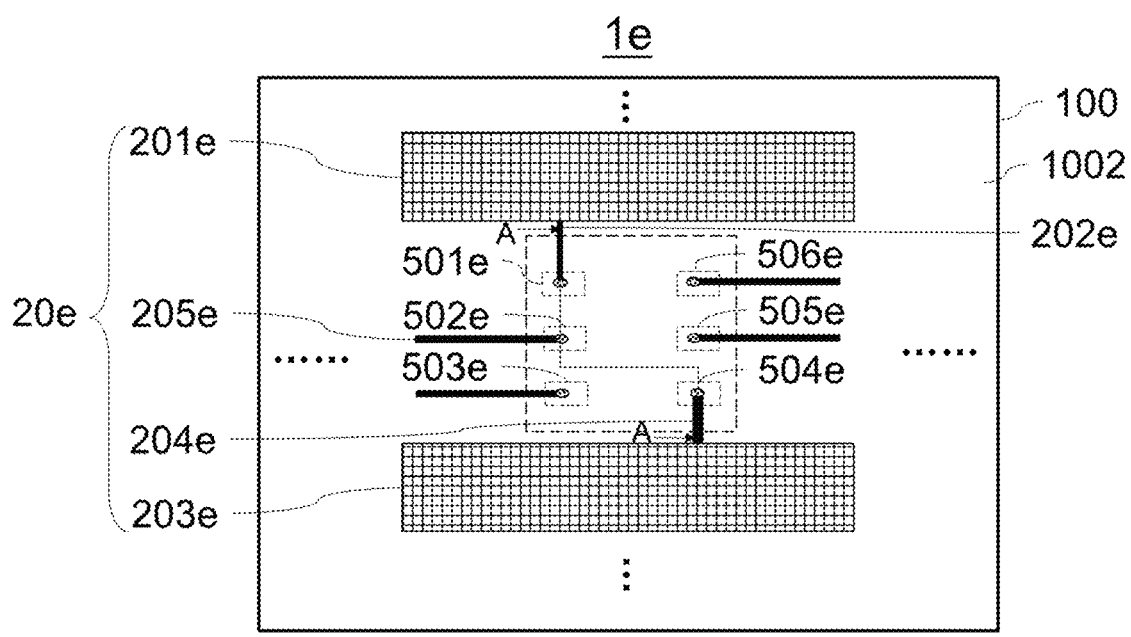
FIG. 5B is a schematic plan view illustrating a second patterned conductive layer disposed on a second surface of the substrate of the light-emitting display device according to the fifth embodiment of the present invention.
Figure 5C:
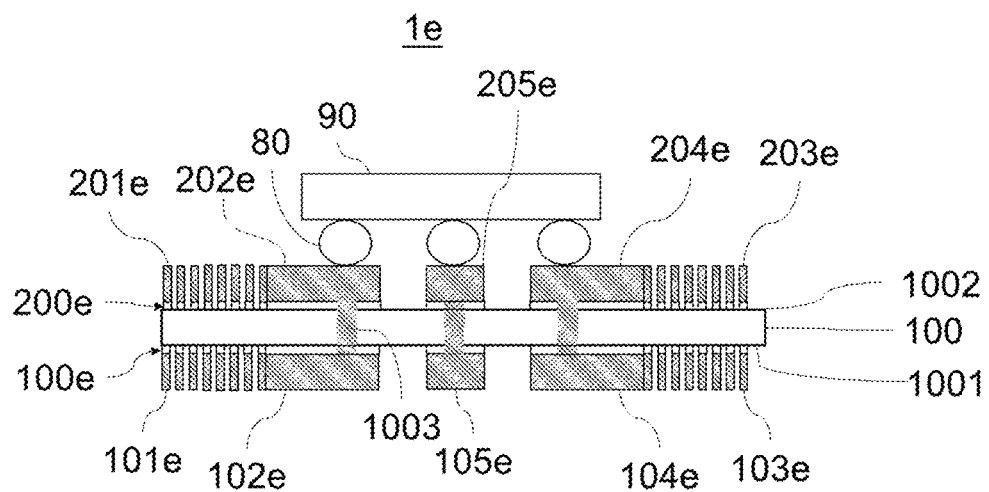
FIG. 5C is a schematic cross-sectional view illustrating A-A section of the light-emitting device of FIG. 5B manufactured in one process.

Referring to FIGS. 5A to 5C, in the fifth embodiment, the light-emitting display device 1e includes a substrate 100, six soldering pad regions including the first soldering pad region 501e to the sixth soldering pad region 506e that are separated and electrically isolated from each other on the substrate 100, and a plurality of passive light-emitting assemblies 90. A first patterned conductive layer 10e is disposed on the first surface 1001, and a second patterned conductive layer 20e is disposed with the first soldering pad region 501e to the sixth soldering pad region 506e on top of the second surface 1002. The following describes only the differences between this embodiment and the abovementioned embodiments.

On the one hand, a multiple-grid shaped first grid wiring 101e, a linear extension 102e of the first grid wiring 101e, the multiple-grid shaped second grid wiring 103e, a linear extension 104e of the second grid wiring 103e and a plurality of linear first slender wires 105e are formed on the first surface 1001. The first grid wiring 101e and the second grid wiring 103e are respectively disposed on the opposite sides of all the first slender wires 105e. The number of the first slender wires 105e is the same as the number of the pins of the passive light-emitting assembly 90 for input and output of the data signal and clock signal. In the embodiment where only four soldering pad regions are disposed, the number of the first slender wires 105e can be only two. The first slender wire 105e does not intersect the first grid wiring 101e or the second grid wiring 103e. The extension 102e is connected with a grid node of the first grid wiring 101e, and the extension 104e is connected with a grid node of the second grid wiring 103e. The extension 102e lays in the configuration plane of the first grid wiring 101e. The extension 104e lays in the configuration plane of the second grid wiring 103e. The laying direction of the first slender wire 105e and the laying direction of the extension 102e or 104e are crossed, for example, are perpendicular. In this embodiment, the first grid wiring 101e, the extension 102e, the second grid wiring 103e, the extension 104e and the first slender wire 105e are all formed in the first patterned conductive layer 10e.

On the other hand, a duplicate wiring 201e of the first grid wiring 101e, a linear extension 202e of the duplicate wiring 201e, a duplicate wiring 203e of the second grid wiring 103e, a linear extension 204e of the duplicate wiring 203e and a plurality of linear second slender wires 205e are formed on the second surface 1002. The number of the second slender wires 205e is the same as the number of the pins of the passive light-emitting assembly 90 for input and output the data signal and clock signal. In the embodiment where only four soldering pad regions are required, the number of the second slender wires 205e can be only two. The second slender wires 205e are duplicate wires of the first slender wires 105e. The second slender wire 205e does not intersect with the duplicate wiring 201e or the duplicate wiring 203e. The extension 202e is connected with a grid node of the duplicate wiring 201e, and the extension 204e is connected with a grid node of the duplicate wiring 203e. The extension 202e lays in the configuration plane of the duplicate wiring 201e. The extension 204e lays in the configuration plane of the duplicate wiring 203e. The laying direction of the second slender wires 205e and the laying direction of the extension 202e or 204e are crossed, for example, are perpendicular. The duplicate wiring 201e and the duplicate wiring 203e are respectively disposed on the opposite sides of all the second slender wires 205e. In this embodiment, the duplicate wiring 201e, the extension 202e, the duplicate wiring 203e, the extension 204e and the second slender wire 205e are all formed in the second patterned conductive layer 20e. Specifically, the duplicate wiring 201e and the first grid wiring 101e have same patterns and are completely overlapped in the vertical direction of the substrate 100, while the duplicate wiring 203e and the second grid wiring 103e have same patterns and are completely overlapped in the vertical direction of the substrate 100. The second slender wires 205e and the first slender wires 105e have same patterns and are overlapped in the vertical direction of the substrate 100.

Referring to FIGS. 5B and 5C, the first soldering pad region 501e which is to be correspondingly electrically connected to the input voltage pin of the passive light-emitting assembly 90 is electrically connected to the duplicate wiring 201e by means of the extension 202e. The fourth soldering pad region 504e which is to be correspondingly electrically connected to the ground pin of the passive light-emitting assembly 90 is electrically connected to the duplicate wiring 203e by means of the extension 204e. The second soldering pad region 502e, the third soldering pad region 503e, the fifth soldering pad region 505e and the sixth soldering pad region 506e which are to be correspondingly electrically connected to data signal input pin, clock signal input pin, clock signal output pin and data signal output pin of the passive light-emitting assembly 90, respectively, are each connected to one of the second slender wires 205e. Furthermore, the first soldering pad region 501e is also connected to the extension 102e by means of the through hole 1003 and therefore electrically connected to the first grid wiring 101e. The fourth soldering pad region 504e is also connected to the extension 104e by means of the through hole 1003 and therefore electrically connected to the second grid wiring 103e. The second soldering pad region 502e, the third soldering pad region 503e, the fifth soldering pad region 505e and the sixth soldering pad region 506e are each connected to one of the first slender wires 105e by means of one of the through holes 1003. In other words, each soldering pad region is connected to two sets of the same patterned wirings respectively located on two opposite surfaces of the substrate 100. In this way, when the first grid wiring 101e is broken, the duplicate wiring 201e can be used to play the same role as the first grid wiring 101e does. When the second grid wiring 103e is broken, the duplicate wiring 203e can be used to play the same role as the second grid wiring 103e does. When any one of the first slender wires 105e is broken, the corresponding second slender wires 205e can be used to play the same role as that one of the first slender wires 105e does. Referring to FIG. 5C, in one embodiment, the light-emitting display device 1e may be formed with a first patterned conductive metallic seed layer 100e on the first surface 1001. The first patterned conductive metallic seed layer 100e has the same patterns as that of the first patterned conductive layer 10e and is served as a preparation layer for the first patterned conductive layer 10e. Similarly, the light-emitting display device 1e may be formed with a second patterned conductive metallic seed layer 200e on the second surface 1002. The second patterned conductive metallic seed layer 200e has the same patterns as that of the second patterned conductive layer 20e and is served as a preparation layer for the second patterned conductive layer 20e. In other embodiments, it may be that only the first patterned conductive metallic seed layer 100e or the second patterned conductive metallic seed layer 200e is required.

Referring to FIGS. 5A to 5C, when it is required that the first soldering pad region 501e which is to be correspondingly electrically connected to the input voltage pin of the passive light-emitting assembly 90 is connected to only one set grid wiring, and the fourth soldering pad region 504e which is electrically connected to the ground pin of the passive light-emitting assembly 90 is connected to only one set grid wiring, the possible situations to configure the gird wirings may be keeping the grid wirings 201e and 103e and removing the grid wirings 101e and 203e, or keeping the grid wirings 203e and 101e and removing the grid wirings 201e and 103e, or keeping the grid wirings 201e and 203e and removing the grid wirings 101e and 103e, or keeping the grid wirings 101e and 103e and removing the grid wirings 201e and 203e.

Figure 6:
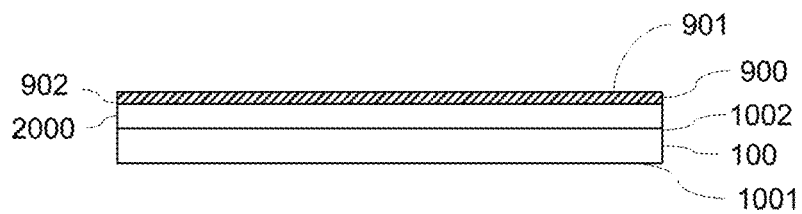
FIG. 6 is a schematic plan view illustrating a stacked structure of a light-emitting display device according to a sixth embodiment of the present invention.
Figure 7:
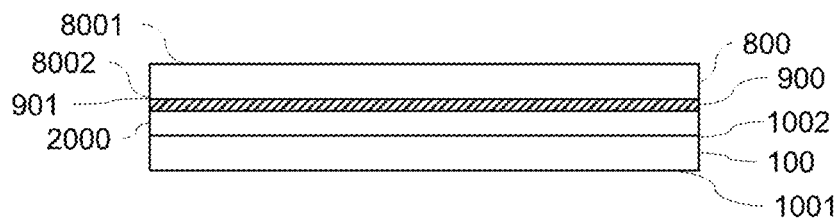
FIG. 7 is a schematic plan view illustrating a stacked structure of a light-emitting display device according to a seventh embodiment of the present invention.
Figure 8:
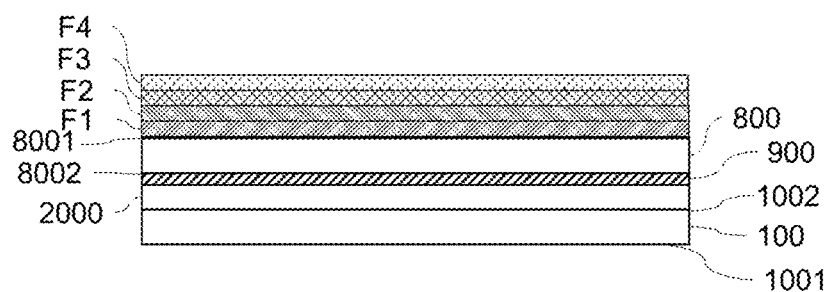
FIG. 8 is a schematic plan view illustrating a stacked structure of a light-emitting display device according to an eighth embodiment of the present invention.

FIG. 6 is a schematic plan view showing the laminated structure of the light-emitting display device according to the sixth embodiment of the present invention. FIG. 7 is a schematic plan view showing the laminated structure of the light-emitting display device according to the seventh embodiment of the present invention. FIG. 8 is a schematic plan view showing the laminated structure of the light-emitting display device according to the eighth embodiment of the present invention.

As shown in FIG. 6, in the sixth embodiment, in addition to the substrate 100, the light-emitting display device may have a wiring layer 2000 and a protective layer 900 in addition to the substrate 100. As shown in FIG. 7, in the seventh embodiment, the light-emitting display device may further have another substrate 800. The substrate 800 and the substrate 100 are located on opposite sides of the wiring layer 2000. The substrate 800 is disposed on top of the protective layer 900 and attached to the top surface 901 of the protective layer 900. The substrate 800 may be a flexible or inflexible plate, sheet or film, and the substrate 800 may be made of the same material as that of the substrate 100. The wiring layer 2000 is defined as a limited space located on top of the substrate 100 to include at least all the wirings and the soldering pad regions of the patterned conductive layer including the soldering pad regions in the foregoing embodiments. This limited space is filled with the material of the protective layer 900 to the extent that the top surface 901 of the protective layer 900 is higher than the top surface of the wiring layer 2000. The protective layer 900 is disposed on the wiring layer 2000 as a whole layer as shown in FIG. 6 to cover the entire wiring layer 2000 to isolate the wiring layer 2000 from contacting the air. With this configuration, the plurality of light-emitting assemblies 90 arranged in an array on top of the substrate 100 are protected by the protective layer 900 from contact with the environment. The rear side of the light-emitting element 90 faces the second surface 1002 of the substrate 100 and the emitting side of the light-emitting element 90 faces the bottom surface 902 of the protective layer 900. In each embodiment, the light emitted from the light-emitting element 90 is preferably perpendicular to the bottom surface 902 of the protective layer 900 to increase the light entering the protective layer 900 as much as possible and to reduce the reflection of the light on the protective layer 900 at the same time. Since the spaces between the light-emitting surface of each light-emitting element 90 and the bottom surface 902 are filled with the materials of the protective layer 900, the light emitted from the light-emitting element 90 directly enters the protective layer 900 after leaving the light-emitting surface of the light-emitting element 90. In FIG. 6, in order to reduce occurrence of the total reflection of the light emitted from the light-emitting element 90 at the interface of the light-emitting surface of the light-emitting element 90 (which may be regarded as the top surface of the wiring layer 2000) and the material of the protective layer 900, the refractive index of the protective layer 900 is preferably greater than or equal to the refractive index of the light-emitting surface of the light-emitting element 90. For example, when the refractive index of the light-emitting surface of the light-emitting element 90 is 1.4 (taking the material of the light-emitting surface being a silyl group as an example), the refractive index of the protective layer 900 is preferably greater than or equal to 1.4. On the other hand, as shown in FIG. 7, when there is another substrate 800 on top of the protective layer 900, in order to reduce the occurrence of total reflection of the light emitted from the light-emitting element 90 at the interface of the top surface 901 of the protective layer 900 and the bottom surface 8002 of the substrate 800, the refractive index of the protective layer 900 is preferably less than the refractive index of the substrate 800. For example, when the substrate 800 is a glass plate, the refractive index of the protective layer 900 is preferably less than or equal to 1.55. Therefore, the refractive index of the protective layer 900 is preferably between 1.4 and 1.55. Alternatively, when the substrate 800 is a release film, the refractive index of the protective layer 900 is preferably less than or equal to the refractive index of the material of the release film. In this way, the amount of light pass through the substrate 800 can be increased, and the amount of light reflected on the substrate 800 can be reduced at the same time. This prevents people behind the substrate 800 from seeing the reflected light of the light-emitting display device.

As shown in FIG. 8, in the eighth embodiment, more than one layer of anti-reflection film is provided on the substrate 800 of FIG. 7. The thickness of the films as shown in the figure is enlarged for clear illustration. When there are more than two layers of anti-reflection films, for example, four layers of anti-reflection films F1, F2, F3, and F4, the lowermost layer of anti-reflection film F1 is attached to the top surface 8001 of the substrate 800. The refractive index of each layer of the anti-reflection films are different. The refractive indices of all the anti-reflection films are greater than the refractive index of the air but less than the refractive index of the substrate 800, and the refractive index of each layer of the anti-reflection films gradually approaches the refractive index of the air as each layer gets closer to the air. As shown in FIG. 8, when the refractive index of the substrate 800 is 1.55, the refractive indices of the anti-reflection films F1, F2, F3, and F4 are, for example, 1.4, 1.3, 1.2, and 1.1. Preferably, among all the anti-reflection films disposed on top of the substrate 800, the refractive index of the lowermost anti-reflection film is the same as or similar to the refractive index of the substrate 800. The refractive index of the uppermost anti-reflection film is the same as or similar to the refractive index of the air. In this way, the reflection of the emitted light and ambient light of the light-emitting element 90 between the substrate 800 and the air can be reduced. After optical simulation experiments, we found that when the refractive index of the substrate 100 and the substrate 800 is 1.5 and the refractive index of the protective layer 900 is 1.45, the reflectivity between the substrate 800 and the air is 8.2. If the anti-reflection films F1, F2, F3, and F4 with refractive index of 1.4, 1.3, 1.2, and 1.1 are provided on the substrate 800, the reflectivity between the substrate 800 and the air drops to 4.4, resulting in more than 45% reduction. When the anti-reflection film on the substrate 800 is a single layer, the refractive index of the anti-reflection film is preferably between the refractive index of the substrate 800 and the refractive index of the air. According to optical simulation experiments, we found that if the refractive index of the substrate 100 and the substrate 800 is 1.5, the refractive index of the protective layer 900 is 1.45 and the refractive index of the single-layer anti-reflection film on the substrate 800 is 1.2, then the reflectivity between the substrate 800 and the air layer is 6, resulting in more than 25% reduction. Preferably, when the anti-reflection film on the substrate 800 is a single layer, the refractive index of the single layer of anti-reflection film approximates to the square root of the refractive index of the substrate 800. The thickness of the anti-reflection film as mentioned above is preferably a multiple of a quarter wavelength of the emitted light of the light-emitting element 90 in accordance with the principle of optical interference.

In the above embodiments, the protective layer 900 is preferably a transparent body to maintain the transparency of the entire light-emitting display device. In this case, the protective layer 900 is preferably made of silicone. The so-called silicone refers to a transparent material that is initially liquid at room temperature and become solid after high-temperature baking. The refractive index of the silicone may vary depending on the material formulation.

To sum up, according to the described light-emitting display device and the manufacturing method, the input voltage connection wiring and the ground wiring for the soldering pad regions are distantly spaced at different sides of a substrate so as to increase the spaces for arrangement of the input voltage connection wiring and the ground wiring, respectively. Therefore, the input voltage connection wiring and the ground wiring can be subdivided into multiple-grid shaped wires with smaller linewidth in the enlarged space to improve the transparency of the display screen. In this way, when the substrate on which the passive light-emitting assembly is mounted is transparent, the visibility of those multiple-grid shaped wires on the substrate in the display screen can be reduced, thereby improving the contrast and clarity of remotely viewing this type of light-emitting display. Furthermore, the patterned conductive layer and the passive light-emitting assembly in the light-emitting display device can be further covered with a transparent protective layer to prevent the patterned conductive layer and the passive light-emitting assembly from being polluted and damaged by the external environment. The optical characteristics of the selected transparent protective layer can increase the amount of light emitted by the passive light-emitting assembly and reduce the amount of reflected light on the screen substrate reaching the wiring layer, thereby preventing people behind the wiring layer from seeing the reflected light. Furthermore, when another transparent substrate is attached to the transparent protective layer, a single-layer or multi-layer anti-reflection film can be arranged on this extra transparent substrate to reduce the reflection of the light emitted from the light-emitting display device and the ambient light between this extra transparent substrate and the air. It can also prevent people behind the wiring layer from seeing the reflected light. On the other hand, since each patterned conductive layer can be produced by a printing process such as screen printing or spray printing, the near-infrared light irradiation may be used to quickly cure the patterned conductive layer to shorten the process time and facilitate the process procedure. Moreover, in terms of manufacturing, the patterned conductive layer may be made of varied materials according to different manufacturing procedure, as long as it is electrically conductive, the material is not limited herein. For example, the grid wiring and its extension in each embodiment may be made of a paste doped with conductive powder which can be further added with chemical plateable material, may be made of high-transparency indium tin oxide (ITO) film, fluorine-doped tin oxide (FTO) film, zinc oxide (ZnO) film, or aluminum oxide zinc (AZO) film, or may be made of copper, silver, nickel, nickel gold, graphene, carbon nanotubes, etc.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangement.

What is claimed is:

1. A light-emitting display device for mounting a plurality of passive light-emitting assemblies with a minimum distance between the passive light-emitting assemblies being at least 2 mm, comprising:
   a substrate having a first surface and a second surface opposite to each other, a plurality of through holes connecting the first surface and the second surface;
   at least four soldering pad regions disposed on the second surface and electrically isolated from one another and correspondingly connected with an input voltage pin, a data signal input pin, a data signal output pin, a clock signal input pin, a clock signal output pin, and a ground pin of one of the passive light-emitting assemblies having a driver IC of at least a light-emitting diode;
   a first grid wiring having a plurality of grids and ranging from ten micrometers to one hundred micrometers in linewidth;
   a second grid wiring having a plurality of grids and ranging from ten micrometers to one hundred micrometers in linewidth;
   a linear extension connecting a grid node of the second grid wiring and laying in the plane of the second grid wiring; and
   a plurality of linear first slender wires laying in a direction with which the first grid wiring and the second grid wiring are not intersected, the number of the first slender wires being the same as the number of the data signal input pin, the data signal output pin, the clock signal input pin, and the clock signal output pin of one of the passive light-emitting assemblies;
   wherein the soldering pad region correspondingly connected with the input voltage pin of one of the passive light-emitting assemblies is in electrical connection with the first gird wiring; the soldering pad region correspondingly connected with the ground pin of one of the passive light-emitting assemblies is in electrical connection with the second grid wiring; the soldering pad region correspondingly connected with the data signal input pin, the data signal output pin, the clock signal input pin, or the clock signal output pin of one of the passive light-emitting assemblies is in electrical connection with one of the first slender wires.

2. The light-emitting display device of claim 1, wherein the first grid wiring is formed in a first patterned conductive layer on top of the first surface of the substrate; the second grid wiring, the linear extension of the second grid wiring, the soldering pad regions, and the linear first slender wires are formed in a second patterned conductive layer on top of the second surface of the substrate; the soldering pad region correspondingly connected with the input voltage pin of the passive light-emitting assembly is in electrical connection with the first gird wiring by means of one of the through holes; and the soldering pad region correspondingly connected with the ground pin of the passive light-emitting assembly is in electrical connection with the second grid wiring by means of the linear extension of the second grid wiring.

3. The light-emitting display device of claim 2, wherein a plurality of the first grid wirings occupy 70% to 90% of the area of the first surface of the substrate.

4. The light-emitting display device of claim 2, wherein the second patterned conductive layer is further formed with an island separated from the second grid wiring and the first slender wire and connected with the first grid wiring by means of one of the through holes; and the soldering pad region correspondingly connected with the input voltage pin of the passive light-emitting assembly is connected to one of the through holes by means of the island.

5. The light-emitting display device of claim 2, further comprising:
   a third grid wiring having a plurality of grids formed in a third patterned conductive layer on top of the second surface and below the second patterned conductive layer, a plurality of the third grid wirings occupying 70% to 90% of the area of the second surface of the substrate; and
   a patterned electrically insulative layer disposed between the third patterned conductive layer and the second patterned conductive layer to electrically isolate the second patterned conductive layer and the third patterned conductive layer;
   wherein a portion of the third grid wiring is in electrical connection with the first grid wiring by means of one of the through holes.

6. The light-emitting display device of claim 5, wherein:
   the patterned electrically insulative layer has a plurality of first electrically insulative segments, a plurality of second electrically insulative segments, and a plurality of third electrically insulative segments; and
   each of the first electrically insulative segments covers a configuration area on the third patterned conductive layer corresponding to the second grid wiring to isolate the electrical contact between the second grid wiring and the third grid wiring; each of the second electrically insulative segments covers a configuration area on the third patterned conductive layer corresponding to a part of the linear extension of the second grid wiring and the soldering pad region connected with the linear extension to isolate the electrical contact between the linear extension, the soldering pad region connected with the linear extension and the third grid wiring; each of the third electrically insulative segments covers a configuration area on the third patterned conductive layer corresponding to each of the first slender wires including the portion connecting the soldering pad region to isolate the electrical contact between the first slender wire and the third grid wiring; and the portion of the third grid wiring which is in electrical connection with the first grid wiring by means of one of the through holes is exposed from the patterned electrically insulative layer.

7. The light-emitting display device of claim 5, wherein:
the patterned electrically insulative layer has a plurality of first electrically insulative segments, a plurality of second electrically insulative segments, and a plurality of third electrically insulative segments; and
each of the first electrically insulative segments covers a configuration area on the third patterned conductive layer corresponding to the second grid wiring to isolate the electrical contact between the second grid wiring and the third grid wiring; each of the second electrically insulative segments covers a configuration area on the third patterned conductive layer corresponding to a part of the linear extension connecting the second grid wiring to isolate the electrical contact between the part of the linear extension and the third grid wiring; each of the third electrically insulative segments covers a configuration area on the third patterned conductive layer corresponding to each of the first slender wires excluding the soldering pad region connecting portion to isolate the electrical contact between the first slender wire and the third grid wiring; the portion of the third grid wiring which is electrically connected to the first grid wiring by means of one of the through holes is exposed from the patterned electrically insulative layer; all of the soldering pad regions are exposed from the patterned electrically insulative layer; the soldering pad region connecting portion of each first slender wire are disposed on the second surface; and the other part of the linear extension which is connected to the soldering pad region correspondingly connected with the ground pin of one of the passive light-emitting assemblies is disposed on the second surface.

8. The light-emitting display device of claim 1, further comprising:
a linear extension of the first grid wiring connecting a grid node of the first grid wiring and laying in the plane for arranging the first grid wiring, wherein the first grid wiring, the linear extension of the first grid wiring, the second grid wiring, the linear extension of the second grid wiring, and the first slender wires are all formed in a first patterned conductive layer formed on the first surface of the substrate; the soldering pad region correspondingly connected with the input voltage pin of one of the passive light-emitting assemblies is in electrical connection with the linear extension of the first grid wiring by means of one of the through holes; and the soldering pad region correspondingly connected with the ground pin of one of the passive light-emitting assemblies is in electrical connection with the linear extension of the second grid wiring by means of one of the through holes.

9. The light-emitting display device of claim 8, wherein the second patterned conductive layer is formed with a plurality of islands each being connected with one of the soldering pad regions and one of the through holes.

10. The light-emitting display device of claim 8, further comprising:
a plurality of linear second slender wires the number of which being the same as the number of the input voltage pin, the data signal input pin, the data signal output pin, the clock signal input pin, the clock signal output pin, and the ground pin of one of the passive light-emitting assemblies;
wherein the second slender wires are duplicate wires of the first slender wires and are overlapped with the first slender wires in the vertical direction of the substrate; the second slender wires and the soldering pad regions are formed in a second patterned conductive layer on top of the second surface of the substrate; and the soldering pad region correspondingly connected with the data signal input pin, the data signal output pin, the clock signal input pin, or the clock signal output pin of one of the passive light-emitting assemblies is in electrical connection with one of the second slender wires.

11. The light-emitting display device of claim 10, further comprising:
a duplicate wiring of the first grid wiring and a linear extension of the duplicate wiring of the first grid wiring, the linear extension of the duplicate wiring of the first grid wiring connecting a grid node of the duplicate wiring of the first grid wiring and laying in the plane for arranging the duplicate wiring of the first grid wiring;
wherein a direction in which the second slender wires lay does not intersect with the duplicate wiring of the first grid wiring; the duplicate wiring of the first grid wiring, the linear extension of the duplicate wiring of the first grid wiring, and the second slender wires are formed in the second patterned conductive layer; the duplicate wiring of the first grid wiring is overlapped with the first grid wiring in the vertical direction of the substrate; and the soldering pad region correspondingly connected with the input voltage pin of one of the passive light-emitting assemblies is in electrical connection with the duplicate wiring of the first grid wiring by means of the linear extension of the duplicate wiring of the first grid wiring.

12. The light-emitting display device of claim 11, further comprising:
a duplicate wiring of the second grid wiring and a linear extension of the duplicate wiring of the second grid wiring, the linear extension of the duplicate wiring of the second grid wiring connecting a grid node of the duplicate wiring of the second grid wiring and laying in the plane for arranging the duplicate wiring of the second grid wiring;
wherein a direction in which the second slender wires lay does not intersect with the duplicate wiring of the second grid wiring; the duplicate wiring of the second grid wiring, the linear extension of the duplicate wiring of the second grid wiring, and the second slender wires are formed in the second patterned conductive layer; the duplicate wiring of the second grid wiring is overlapped with the second grid wiring in the vertical direction of the substrate; and the soldering pad region correspondingly connected with the ground pin of one of the passive light-emitting assemblies is in electrical connection with the duplicate wiring of the second grid wiring by means of the linear extension of the duplicate wiring of the second grid wiring.

13. The light-emitting display device of claim 1, further comprising:
a transparent protective layer disposed on top of the passive light-emitting assemblies, wherein the protective layer has its top surface being higher than the top surfaces of all of the passive light-emitting assemblies, covers all of the passive light-emitting assemblies, and has a refractive index being greater than or equal to the refractive index of a light-emitting surface of one of the passive light-emitting assemblies.

14. The light-emitting display device of claim 13, further comprising:
a transparent substrate disposed on top of the transparent protective layer and attached to the top surface of the transparent protective layer, wherein the refractive index of the transparent substrate is greater than or equal to the refractive index of the protective layer.

15. The light-emitting display device of claim 14, further comprising:
at least one anti-reflection film disposed on the top surface of the transparent substrate, wherein the refractive index of the anti-reflection film is smaller than or equal to the refractive index of the transparent substrate while greater than or equal to the refractive index of the air.

* * * * *